(12) United States Patent
Nagashima et al.

(10) Patent No.: US 9,847,342 B2
(45) Date of Patent: Dec. 19, 2017

(54) SEMICONDUCTOR MEMORY DEVICE AND METHOD FOR MANUFACTURING SAME

(71) Applicant: Toshiba Memory Corporation, Minato-ku (JP)

(72) Inventors: Satoshi Nagashima, Yokkaichi (JP); Katsumi Yamamoto, Yokkaichi (JP); Kohei Sakaike, Yokkaichi (JP); Tatsuya Kato, Yokkaichi (JP); Keisuke Kikutani, Yokkaichi (JP); Fumitaka Arai, Yokkaichi (JP); Atsushi Murakoshi, Yokkaichi (JP); Shunichi Takeuchi, Kawasaki (JP); Katsuyuki Sekine, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/268,126

(22) Filed: Sep. 16, 2016

(65) Prior Publication Data
US 2017/0263619 A1 Sep. 14, 2017

Related U.S. Application Data

(60) Provisional application No. 62/307,916, filed on Mar. 14, 2016.

(51) Int. Cl.
*H01L 29/788* (2006.01)
*H01L 27/11556* (2017.01)
(Continued)

(52) U.S. Cl.
CPC ........ *H01L 27/11556* (2013.01); *H01L 21/31* (2013.01); *H01L 27/11521* (2013.01);
(Continued)

(58) Field of Classification Search
CPC ............... H01L 29/0649; H01L 29/513; H01L 27/11521; H01L 27/11556; H01L 21/31; H01L 21/306
See application file for complete search history.

(56) References Cited

U.S. PATENT DOCUMENTS 8,084,819 B2   12/2011   Kim et al.
8,330,208 B2   12/2012   Alsmeier et al.
(Continued)

FOREIGN PATENT DOCUMENTS

JP   2010-157734 A   7/2010
JP   2010-192569 A   9/2010
(Continued)

*Primary Examiner* — Yosef Gebreyesus
(74) *Attorney, Agent, or Firm* — Oblon, McClelland, Maier & Neustadt, L.L.P.

(57) ABSTRACT

A semiconductor memory device includes a first structural body, a second structural body and interconnections. The first and the second structural bodies are separated in a first direction and extend in a second direction. The interconnections are provided between the first structural body and the second structural body, extend in the second direction, and are separated from each other along a third direction. The first and the second structural bodies each includes an insulating member, a column-shaped body and an insulating film. The insulating member and the column-shaped body are disposed in an alternating manner along the second direction and extend in the third direction. The insulating members of the first and second structural bodies make contact with the interconnections.

9 Claims, 36 Drawing Sheets

(51) Int. Cl.
  *H01L 29/51*    (2006.01)
  *H01L 27/11521* (2017.01)
  *H01L 29/06*    (2006.01)
  *H01L 21/31*    (2006.01)
  *H01L 21/306*   (2006.01)

(52) U.S. Cl.
  CPC ........ *H01L 29/0649* (2013.01); *H01L 29/513* (2013.01); *H01L 21/306* (2013.01)

(56) References Cited

U.S. PATENT DOCUMENTS

| | | |
|---|---|---|
| 8,436,414 B2 | 5/2013 | Tanaka et al. |
| 8,569,829 B2 | 10/2013 | Kiyotoshi |
| 2012/0267699 A1* | 10/2012 | Kiyotoshi ......... H01L 27/11524 257/319 |
| 2014/0197546 A1 | 7/2014 | Hwang et al. |
| 2015/0200199 A1 | 7/2015 | Sakamoto et al. |
| 2016/0093382 A1 | 3/2016 | Sakamoto et al. |
| 2016/0190147 A1 | 6/2016 | Kato et al. |
| 2016/0322373 A1 | 11/2016 | Sakamoto et al. |

FOREIGN PATENT DOCUMENTS

| | | |
|---|---|---|
| JP | 2011-138945 A | 7/2011 |
| JP | 2011-165972 A | 8/2011 |
| JP | 2013-534058 A | 8/2013 |
| JP | 2014-138188 A | 7/2014 |
| WO | WO 2016/135849 A1 | 9/2016 |
| WO | WO 2016/139727 A1 | 9/2016 |
| WO | WO 2016/178263 A1 | 11/2016 |

\* cited by examiner

FIG. 18A
FIG. 18B
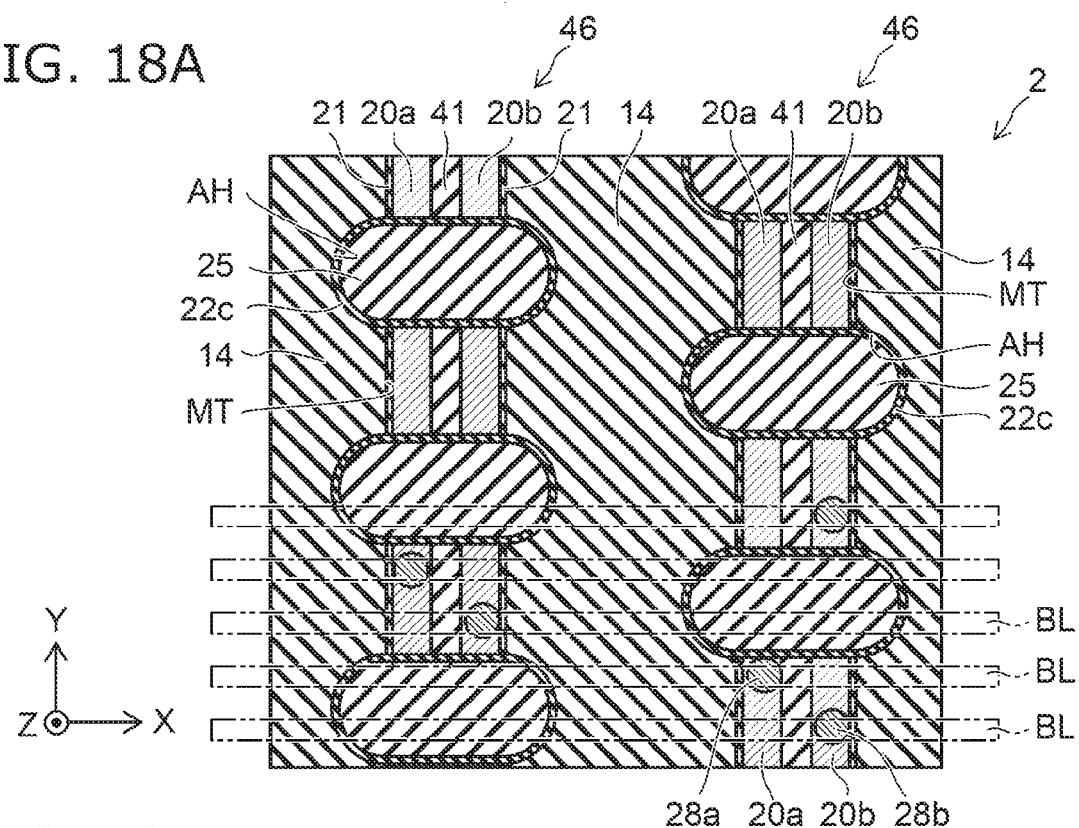
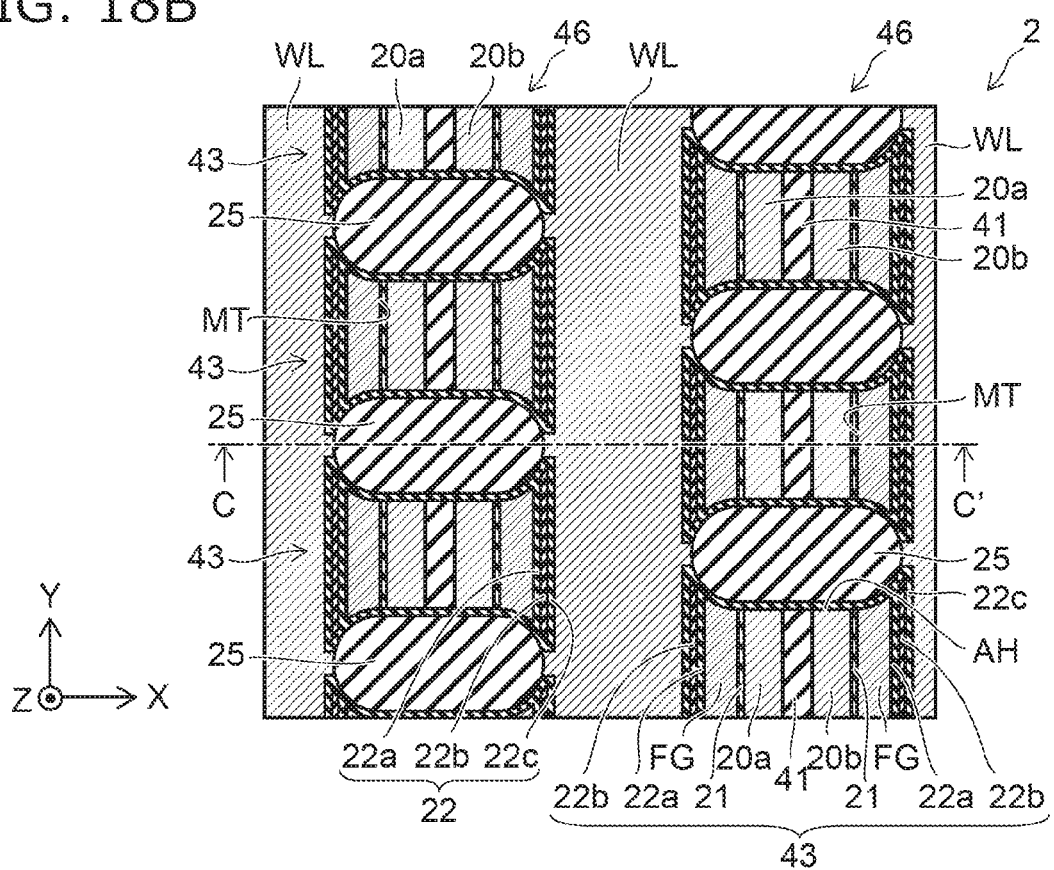

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/307,916, filed on Mar. 14, 2016; the entire contents of which are incorporated herein by reference.

FIELD

Embodiments relate generally to a semiconductor memory device and a method for manufacturing the same.

BACKGROUND

A stacked type semiconductor memory device in which memory cells are integrated three-dimensionally has recently been proposed. In such a stacked type semiconductor memory device, a stacked body in which electrode films and insulating films are stacked in an alternating manner on a semiconductor substrate is provided, and a semiconductor member passing through the stacked body is provided. A memory cell is formed at each section where one of the electrode films and the semiconductor member intersects. There is demand for a higher degree of integration in such a semiconductor memory device as well.

BRIEF DESCRIPTION OF THE DRAWINGS

FIG. 18A is a cross-sectional view taken from a line A-A' indicated in FIG. 17, and FIG. 18B is a cross-sectional view taken from a line B-B' illustrated in FIG. 17;

DETAILED DESCRIPTION

A semiconductor memory device according to one embodiment, includes a first structural body, a second structural body and a plurality of interconnections. The first structural body and the second structural body are separated in a first direction and extend in a second direction intersecting with the first direction. The plurality of interconnections are provided between the first structural body and the second structural body, extend in the second direction, and are separated from each other along a third direction. The third direction intersects with a plane including the first direction and the second direction. The first structural body and the second structural body each includes an insulating member, a column-shaped body and an insulating film. The insulating member and the column-shaped body are disposed in an alternating manner along the second direction and extend in the third direction. The insulating film is provided between the column-shaped body and the interconnections. The column-shaped body includes a first semiconductor member, a second semiconductor member and an electrode. The first semiconductor member and the second semiconductor member are separated from each other along the first direction and extend in the third direction. The electrode is provided between the first semiconductor member and each of the interconnections. The insulating member of the first structural body and the insulating member of the second structural body make contact with the plurality of interconnections.

A method for manufacturing a semiconductor memory device includes forming a stacked body by depositing first films and a second film in an alternating manner on a substrate. The method includes forming a trench extending in a first direction in the stacked body. The method includes forming a recess extending in the first direction in a side surface of the trench by removing part of the second film through the trench. The method includes forming an insulating film on a back surface of the recess. The method includes forming an electrode in the recess. The method includes embedding a semiconductor member in the trench. The method includes separating the semiconductor member and the electrode along the first direction by forming a hole in the stacked body. The method includes embedding an insulating member in the hole. The method includes forming a through hole in the stacked body. The method includes forming a space between the first films by removing a remaining portion of the second film through the through hole. The method includes forming an interconnection within the space.

First Embodiment

First, a first embodiment will be described.

Figure 1:
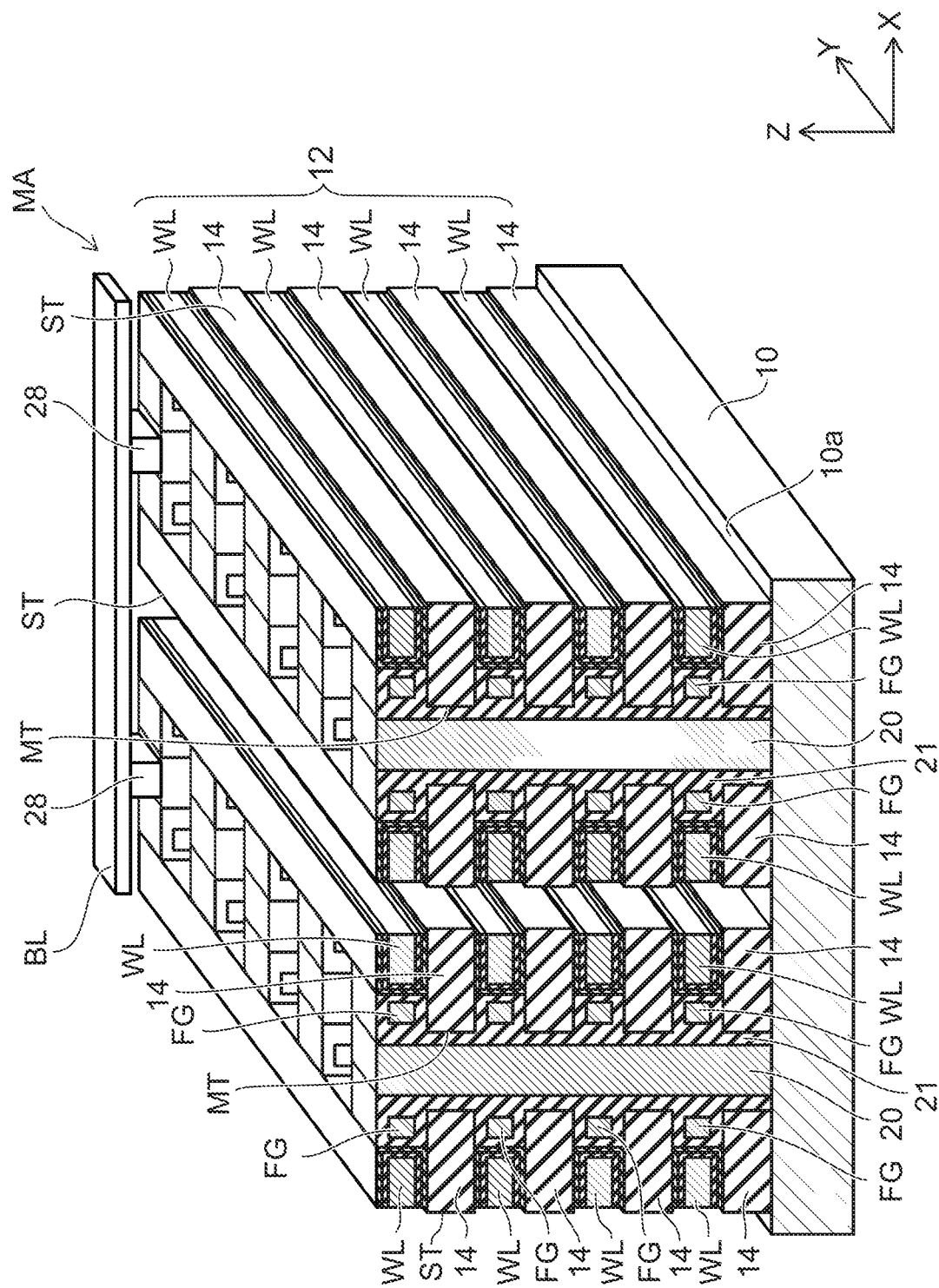
FIG. 1 is a perspective view illustrating a semiconductor memory device according to a first embodiment.

FIG. 1 is a perspective view illustrating a semiconductor memory device according to the embodiment.

Figure 2:
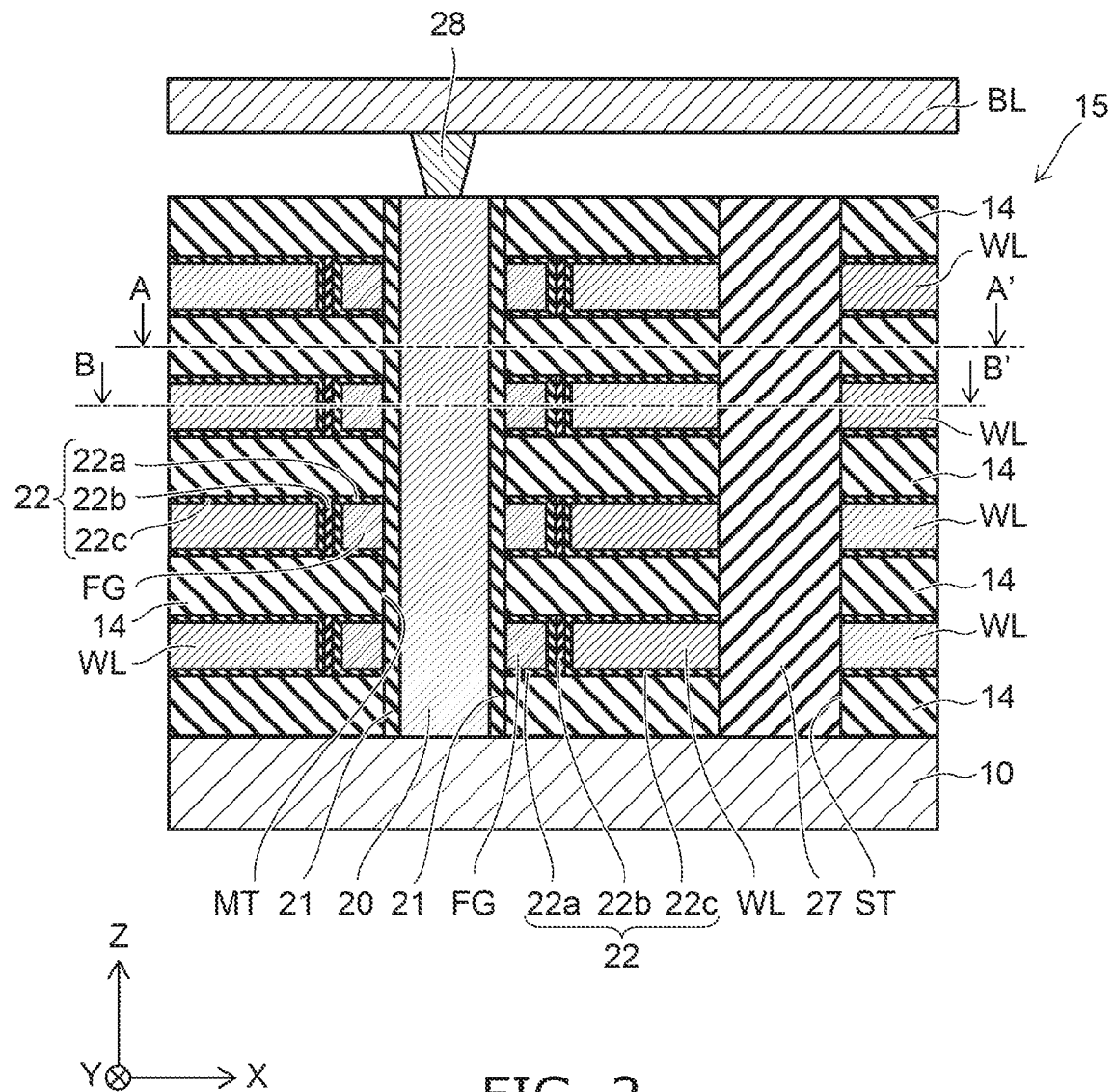
FIG. 2 is a cross-sectional view illustrating the semiconductor memory device according to the first embodiment.

FIG. 2 is a cross-sectional view illustrating the semiconductor memory device according to the embodiment.

Figure 3A:
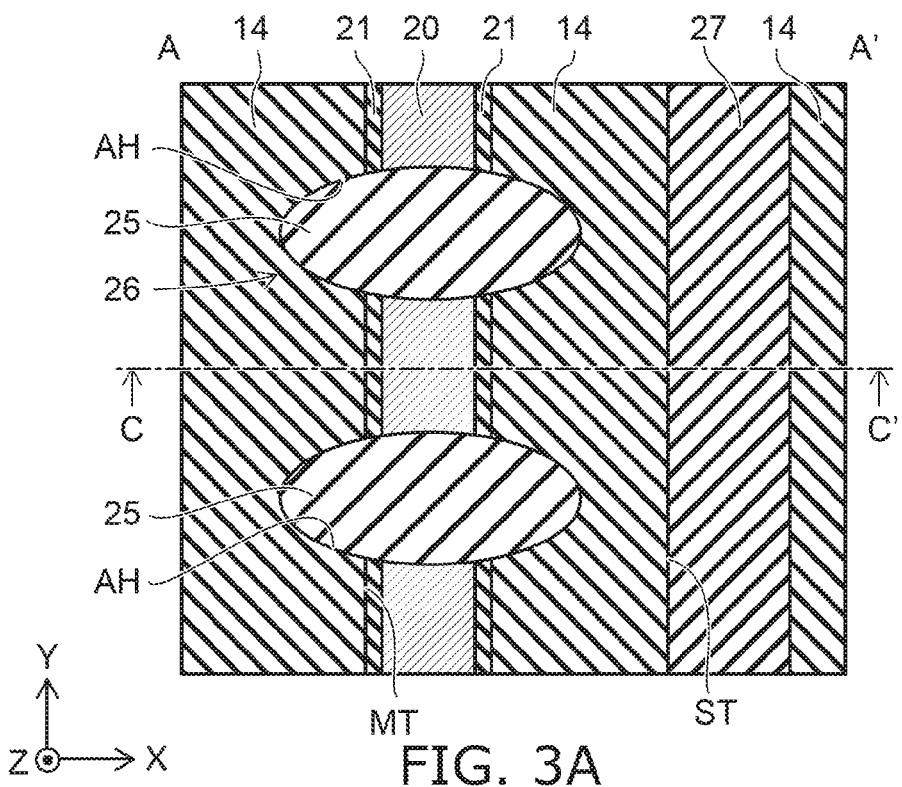
FIG. 3A is a cross-sectional view taken from a line A-A' indicated in FIG. 2.
Figure 3B:
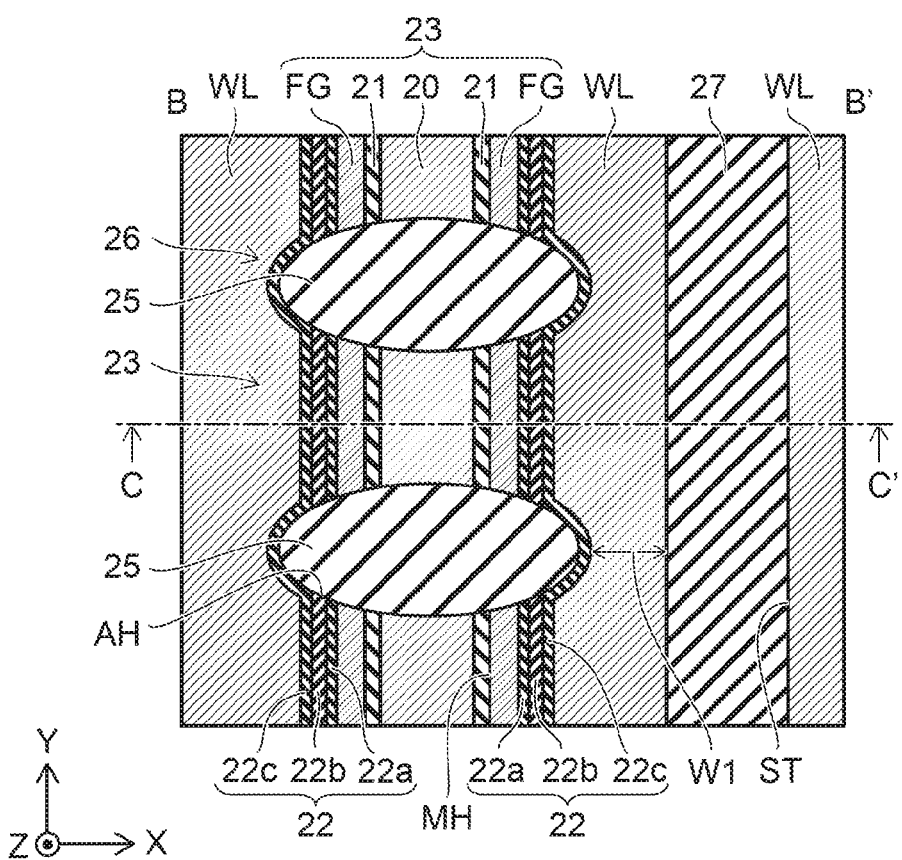
FIG. 3B is a cross-sectional view taken from a line B-B' illustrated in FIG. 2.

FIG. 3A is a cross-sectional view taken from a line A-A' indicated in FIG. 2, and FIG. 3B is a cross-sectional view taken from a line B-B' illustrated in FIG. 2.

FIG. 2 is a cross-sectional view taken from a line C-C' indicated in FIGS. 3A and 3B.

As illustrated in FIG. 1, a silicon substrate 10 is provided in a semiconductor memory device 1 according to the embodiment. The silicon substrate 10 is formed of, for example, monocrystalline silicon (Si). A stacked body 12 is provided on the silicon substrate 10. Vias 28 are provided on the stacked body 12, and a bit line BL is provided on the vias 28.

In this patent specification, the following XYZ orthogonal coordinate system is used to simplify the descriptions. Two mutually perpendicular directions parallel to an upper surface 10a of the silicon substrate 10 are defined as an "X-direction" and a "Y-direction". In this patent specification, the direction in which the bit line BL extends is assumed to be the X-direction. A direction perpendicular to the upper surface 10a of the silicon substrate 10 is defined as a "Z-direction". In the Z-direction, a direction toward the stacked body 12 from the silicon substrate 10 is also referred to as "up" and the direction opposite therefrom is also referred to as "down", but this distinction is made only for convenience and is unrelated to the direction of gravity.

In the stacked body 12, interlayer insulating films 14 formed of silicon oxide (SiO), for example, are arranged along the Z-direction and separated from each other. A plurality of memory trenches MT extending in the Y-direction and a plurality of slits ST extending in the Y-direction are formed in the stacked body 12. The memory trenches MT and the slits ST are arranged in an alternating manner along the X-direction. Each memory trench MT and each slit ST passes through the stacked body 12 and reaches the silicon substrate 10. In this patent specification, a constituent element extending in the Y-direction means that of the lengths of that constituent element in the X-direction, the Y-direction, and the Z-direction, the length in the Y-direction is the longest. The same applies for the other directions as well. In each memory trench MT and each slit ST, the longest direction is the Y-direction, the next-longest direction is the Z-direction, and the shortest direction is the X-direction.

In the stacked body 12, a single word line WL extending in the Y-direction and a plurality of floating gate electrodes FG arranged along the Y-direction are provided between the memory trenches MT and the slits ST in the X-direction and between the interlayer insulating films 14 in the Z-direction. As such, in the stacked body 12, the word lines WL are arranged in a two-dimensional matrix along the X-direction and the Z-direction. The floating gate electrodes FG are arranged in a three-dimensional matrix along the X-direction, the Y-direction, and the Z-direction.

The word lines WL are formed of a conductive material, each being constituted of a main body part (not illustrated) formed of tungsten (W) and a barrier metal layer (not illustrated) formed of titanium nitride (TiN), for example. The barrier metal layer is disposed on the main body part, on an upper surface, a lower surface, and a side surface facing the floating gate electrodes FG. The floating gate electrodes FG are formed of a conductive material, and are formed of polysilicon containing impurities, for example.

A plurality of semiconductor members 20 are provided within each memory trench MT. The semiconductor members 20 are formed of silicon, for example. Each semiconductor member 20 has a substantially quadrangular column shape extending in the Z-direction, with a bottom end thereof connected to the silicon substrate 10 and a top end thereof connected to the bit line BL by the via 28.

The plurality of semiconductor members 20 are separated from each other in a row along the Y-direction. The semiconductor members 20 are disposed in the same positions as the floating gate electrodes FG with respect to the Y-direction. The floating gate electrodes FG are therefore disposed between the semiconductor members 20 and the word lines WL. Additionally, each semiconductor member 20 is disposed between floating gate electrodes FG separated in the X-direction with a memory trench MT therebetween.

As illustrated in FIGS. 2, 3A, and 3B, a tunnel insulating film 21 is provided between each semiconductor member 20 and the plurality of floating gate electrodes FG arranged in a row along the Z-direction. The tunnel insulating film 21 is shaped as a band extending in the Z-direction. The tunnel insulating film 21 is normally an insulating film. However, when a predetermined voltage within the range of a driving voltage of the semiconductor memory device 1 is applied, a tunnel current flows in the tunnel insulating film 21. The tunnel insulating film 21 is, for example, an ONO film formed by depositing a silicon oxide layer, a silicon nitride layer, and a silicon oxide layer. Note that the tunnel insulating film 21 may be a single layer of a silicon oxide film.

A column-shaped body 23 is formed by a single semiconductor member 20, the tunnel insulating films 21 on both sides thereof in the X-direction, and the floating gate electrodes FG on both sides thereof in the X-direction. An insulating member 25 formed of silicon oxide, for example, is provided between adjacent column-shaped bodies 23 in the Y-direction. The insulating member 25 has a substantially elliptical column shape with an axis direction in the Z-direction, a major axis direction in the X-direction, and a minor axis direction in the Y-direction. Note that the term "substantially elliptical" in this patent specification is a broad concept including circles, ovals, quadrangles with rounded corners, and the like in addition to a strict ellipse in the geometric sense. The column-shaped bodies 23 and the insulating members 25 are arranged in an alternating manner and in contact with each other in the Y-direction. A plate-like structural body 26 spreading out along an YZ plane is formed by the column-shaped bodies 23 and the insulating members 25 arranged in a row along the Y-direction.

A high dielectric constant layer 22a is provided on the floating gate electrodes FG, on upper surfaces, lower surfaces, and side surfaces facing the word lines WL. Meanwhile, a high dielectric constant layer 22c is provided on the word lines WL, on upper surfaces, lower surfaces, and side surfaces facing the structural body 26. A low dielectric constant layer 22b is provided between the high dielectric constant layer 22a and the high dielectric constant layer 22c. The high dielectric constant layers 22a and 22c have a higher dielectric constant than the dielectric constant of the low dielectric constant layer 22b. The high dielectric constant layers 22a and 22c are formed of hafnium silicon oxide (HfSiO), aluminum oxide (AlO), or silicon nitride (SiN), for example, and are formed of hafnium silicon oxide, for example. Note that the high dielectric constant layers 22a and 22c may be formed by stacking a plurality of layers formed of the above-described materials, and may be, for example, ONO layers in which a silicon oxide layer, a silicon nitride layer, and a silicon oxide layer are stacked in that order, or NON layers in which a silicon nitride layer, a silicon oxide layer, and a silicon nitride layer are stacked in that order. Additionally, the high dielectric constant layer 22a may be an NRN layer in which a silicon nitride layer, a ruthenium (Ru) layer, and a silicon nitride layer are stacked in that order. The low dielectric constant layer 22b is formed of, for example, silicon oxide (SiO).

A block insulating film 22 is constituted by the high dielectric constant layer 22a, the low dielectric constant layer 22b, and the high dielectric constant layer 22c. The block insulating film 22 is a film through which a current substantially does not flow even when a voltage within the range of the driving voltage of the semiconductor memory device 1 is applied. An average dielectric constant of the block insulating film 22 as a whole is greater than an average dielectric constant of the tunnel insulating film 21 as a whole. An insulating member 27 formed of silicon oxide, for example, is provided within each of the slits ST. Note that the insulating members 25 and 27 are not illustrated in FIG. 1 for the sake of simplicity.

Next, a method for manufacturing the semiconductor memory device according to the embodiment will be described.

FIGS. 4 to 10 are perspective views illustrating the method for manufacturing the semiconductor memory device according to the embodiment.

FIGS. 11A to 15 are cross-sectional views illustrating the method for manufacturing the semiconductor memory device according to the embodiment.

Figure 4:
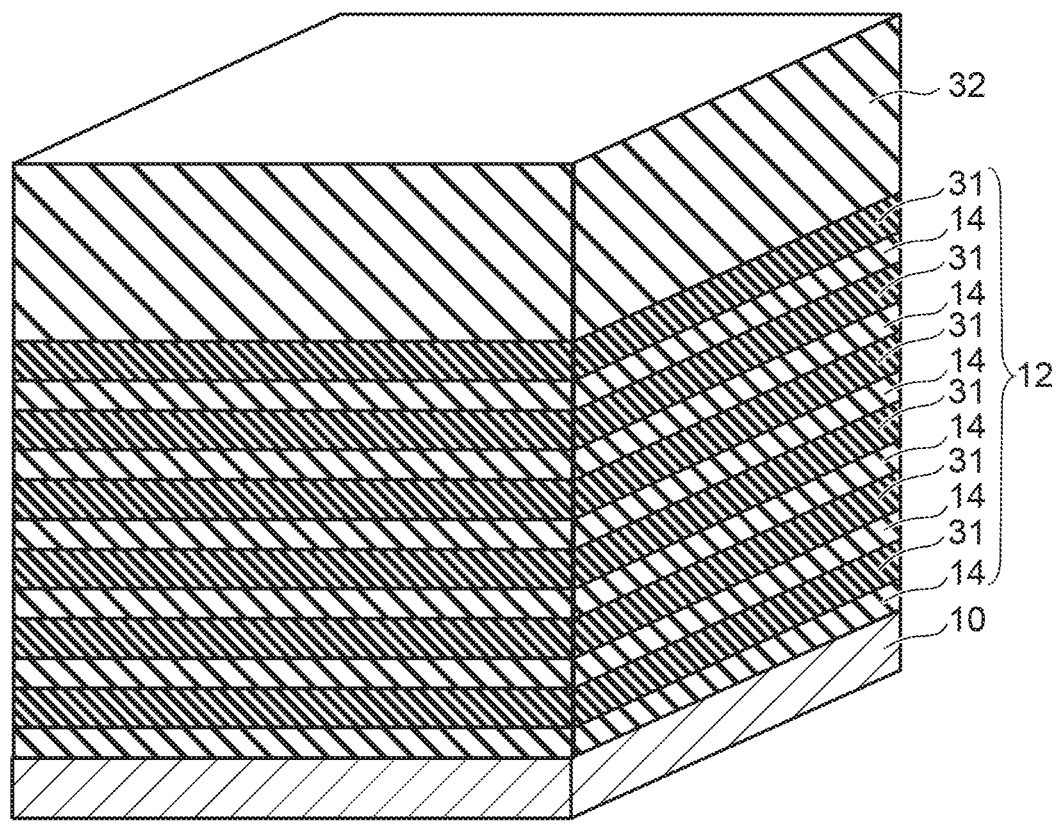
FIGS. 4 to 10 are perspective views illustrating a method for manufacturing a semiconductor memory device according to the first embodiment.

First, as illustrated in FIG. 4, a silicon oxide film and a silicon nitride film are deposited alternately on the silicon substrate 10 through CVD (chemical vapor deposition), for example. As a result, the interlayer insulating films 14 formed of silicon oxide and sacrificial films 31 formed of silicon nitride are stacked alternately along the Z-direction, thus forming the stacked body 12. Next, a mask film 32 is formed on the stacked body 12 through CVD using tetra ethyl ortho silicate (TEOS) ($Si(OC_2H_5)_4$) as a raw material.

Figure 5:
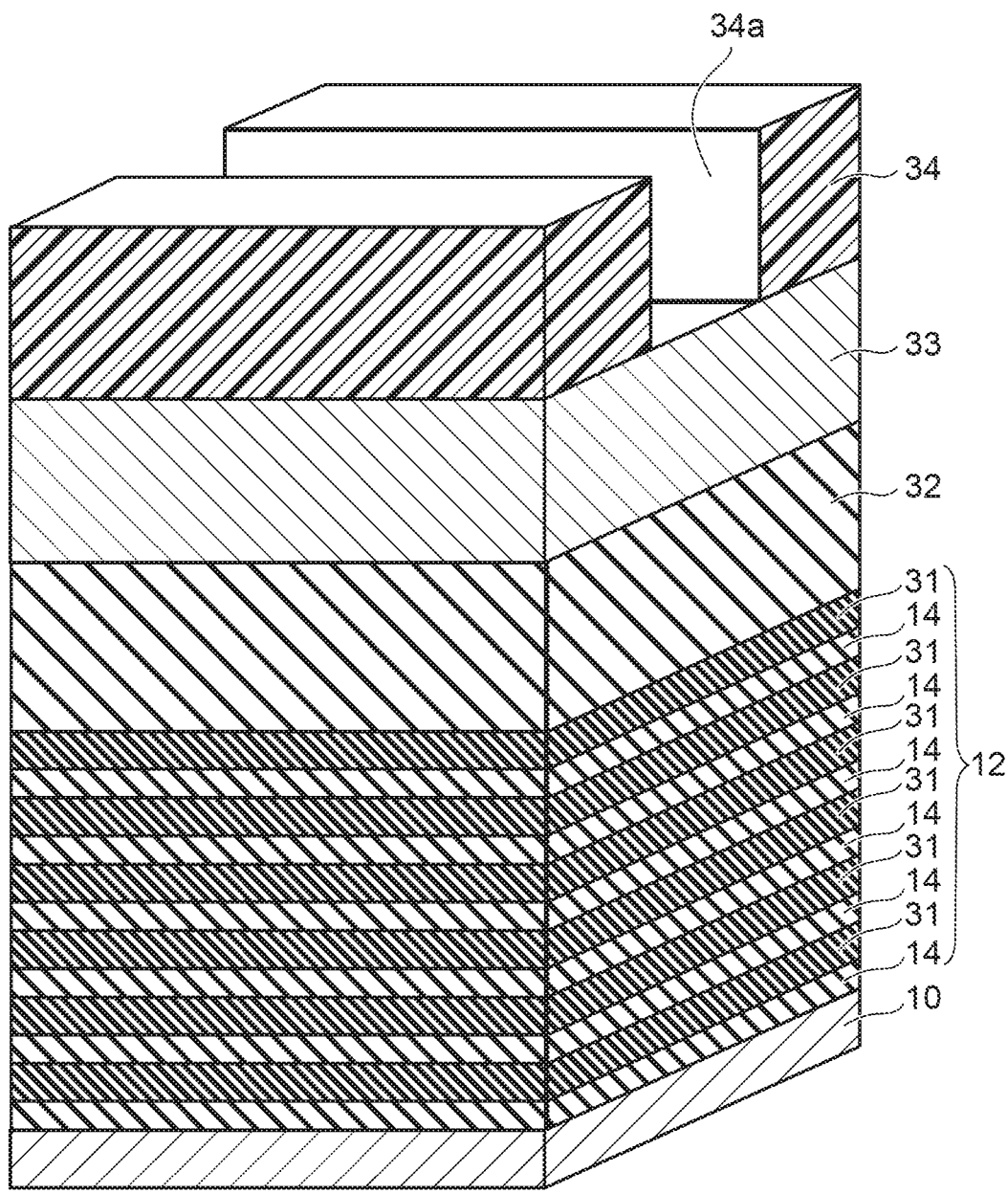

Next, as illustrated in FIG. 5, a hard mask film 33 containing carbon (C) and an antireflective film (not illustrated) are formed on the mask film 32. Next, a resist film is formed, and a resist pattern 34 is formed by exposing, developing, and patterning the resist film. A plurality of openings 34a extending in the Y-direction are formed in the resist pattern 34 along the X-direction.

Figure 6:
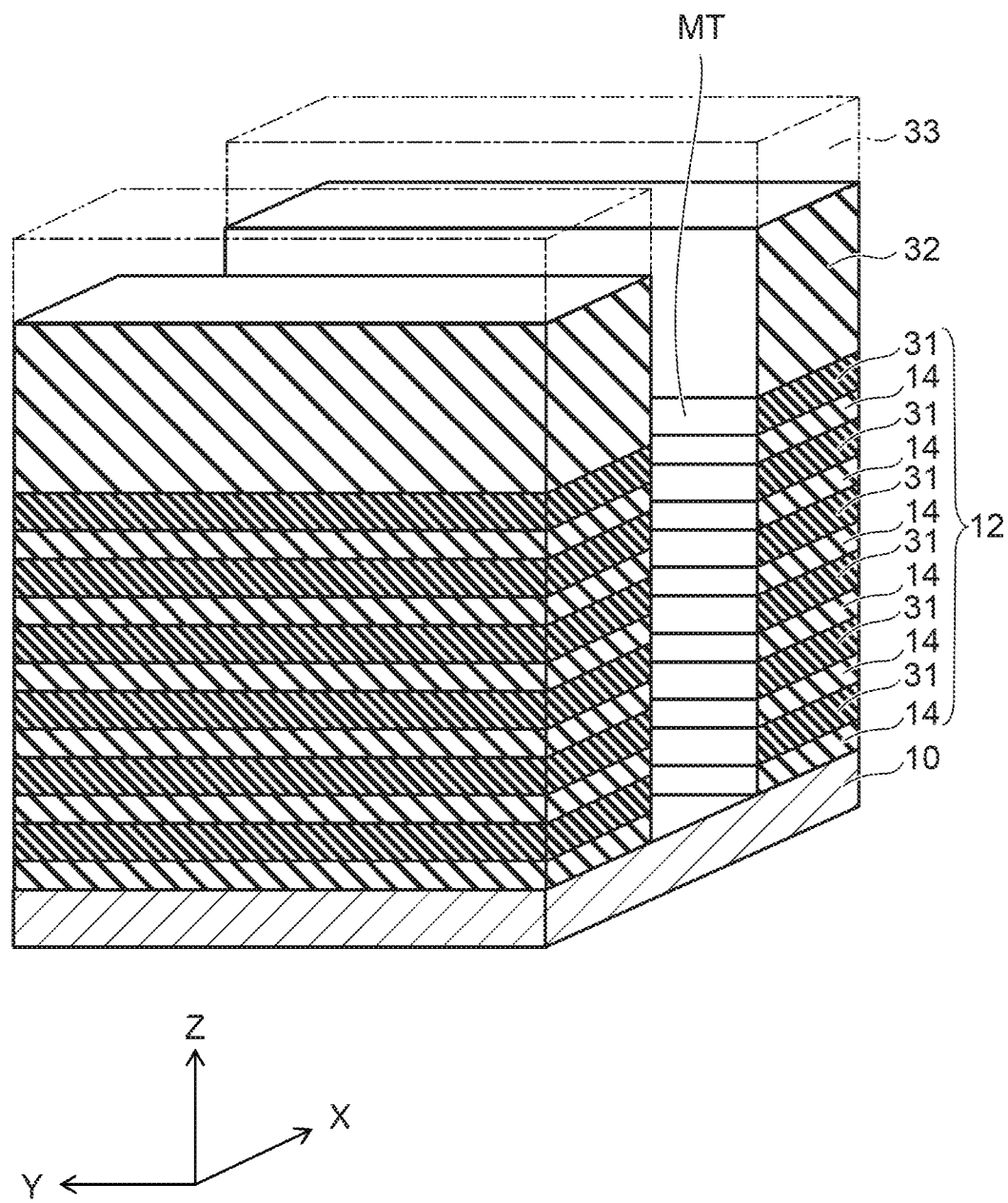

Next, as illustrated in FIG. 6, by carrying out anisotropic etching such as reactive ion etching (RIE) using the resist pattern 34 as a mask, the pattern of the resist pattern 34 is transferred to the hard mask film 33 and the mask film 32, and the stacked body 12 is processed using the hard mask film 33 and the mask film 32 as masks. The resist pattern 34 and the hard mask film 33 are removed during this process.

Figure 7:
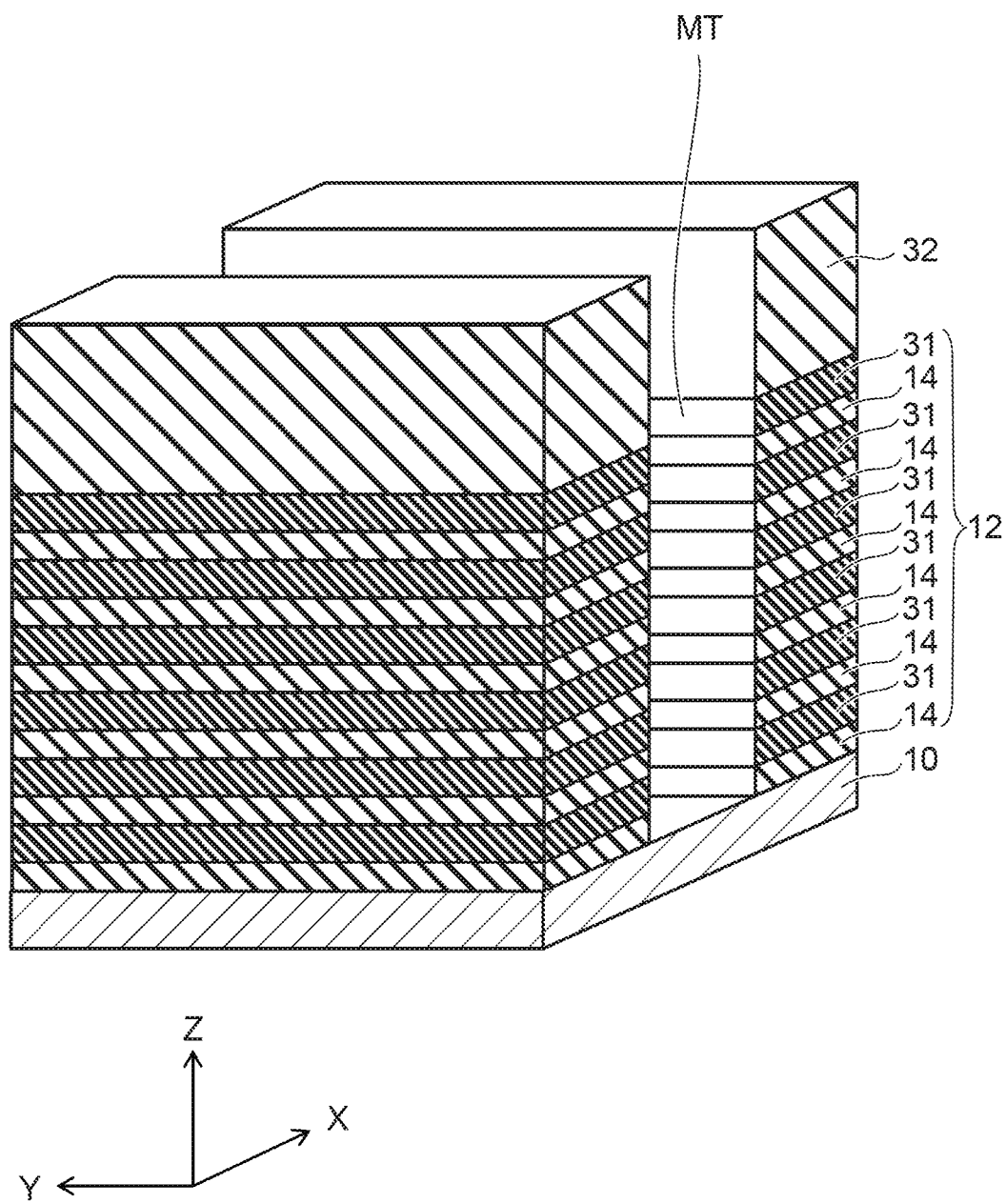

As a result, a plurality of the memory trenches MT extending in the Y-direction and reaching the silicon substrate 10 are formed in the stacked body 12 along the X-direction, as illustrated in FIG. 7.

Figure 8:
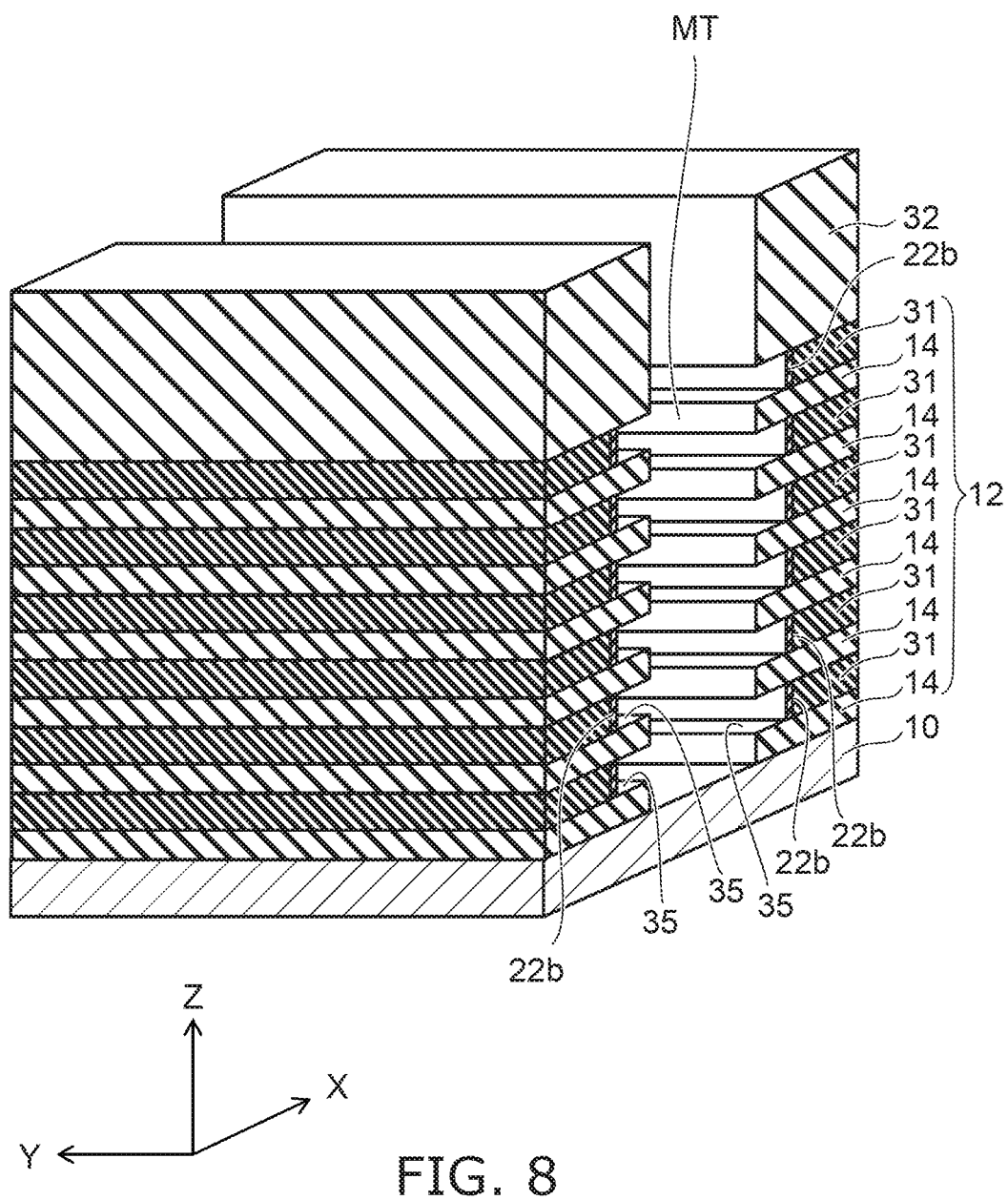

Next, as illustrated in FIG. 8, wet etching is carried out over the memory trenches MT using hot phosphoric acid, for example. As a result, the portions of the sacrificial films 31 exposed within the memory trenches MT are removed, forming recesses 35 in the side surfaces of the memory trenches MT. The recesses 35 extend in the Y-direction along the memory trenches MT. Next, an oxidizing treatment is carried out. As a result, the exposed surfaces of the sacrificial films 31 are oxidized, and the low dielectric constant layer 22b made from silicon oxide is formed on the back surface of each of the recesses 35.

Figure 9:
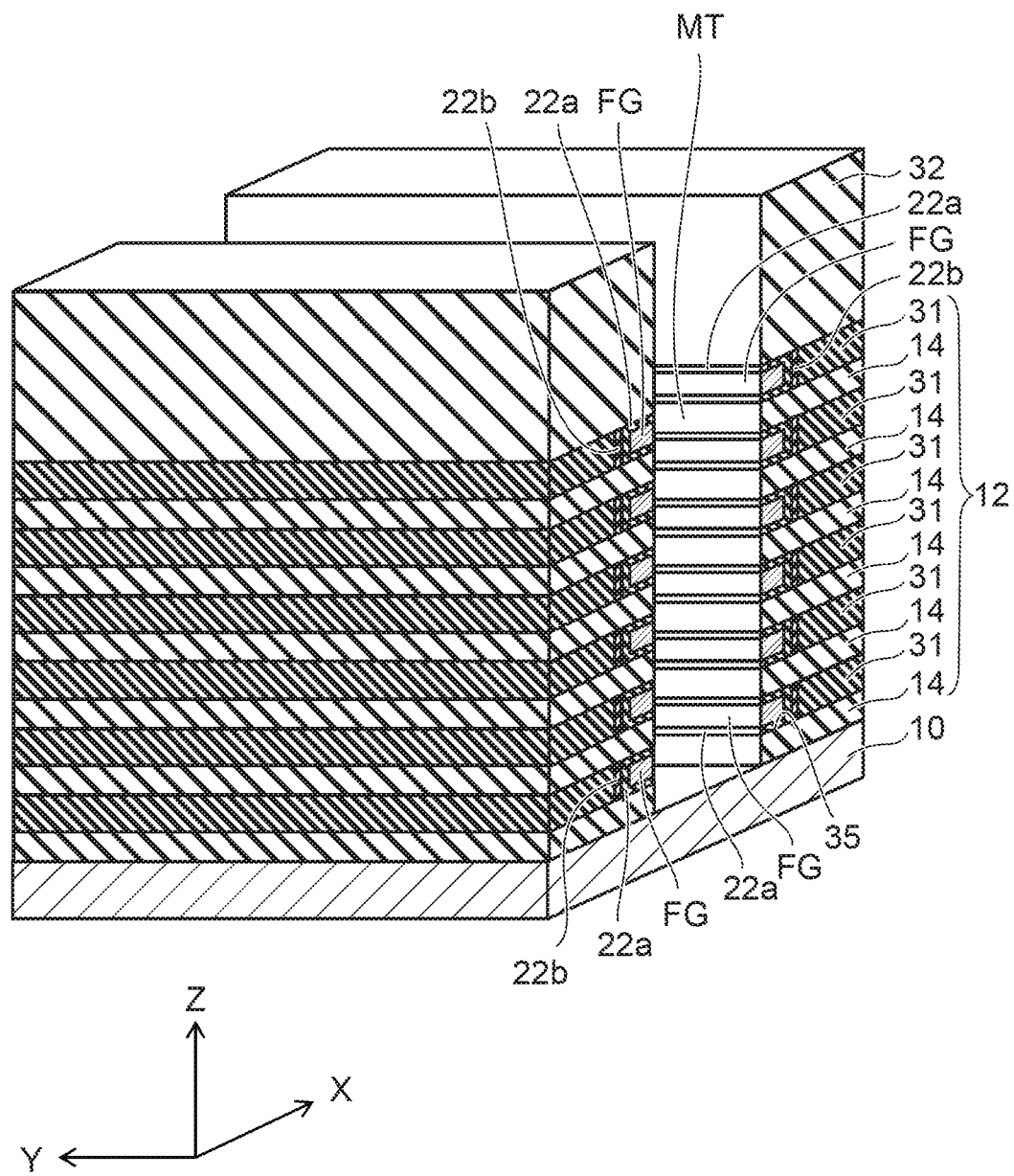

Next, as illustrated in FIG. 9, a high dielectric constant material such as hafnium silicon oxide (HfSiO) is deposited on the entire surface through CVD, for example. The high dielectric constant layers 22a are formed substantially uniformly on the inner surfaces of the memory trenches MT as a result. The high dielectric constant layers 22a are also formed on the inner surfaces of the recesses 35 and make contact with the low dielectric constant layers 22b.

Next, silicon is deposited onto the entire surface. A silicon film is formed on the inner surfaces of the memory trenches MT as a result. The silicon film is formed so that the recesses 35 are filled but the memory trenches MT are not completely filled. Next, anisotropic etching such as RIE is carried out in order to recess the silicon film. As a result, portions of the silicon film deposited on outer portions of the recesses 35 are removed, and the portions remaining in the recesses 35 serve as the floating gate electrodes FG. Next, anisotropic etching is carried out to recess the high dielectric constant layers 22a, and those layers remain only in the recesses 35.

Figure 10:
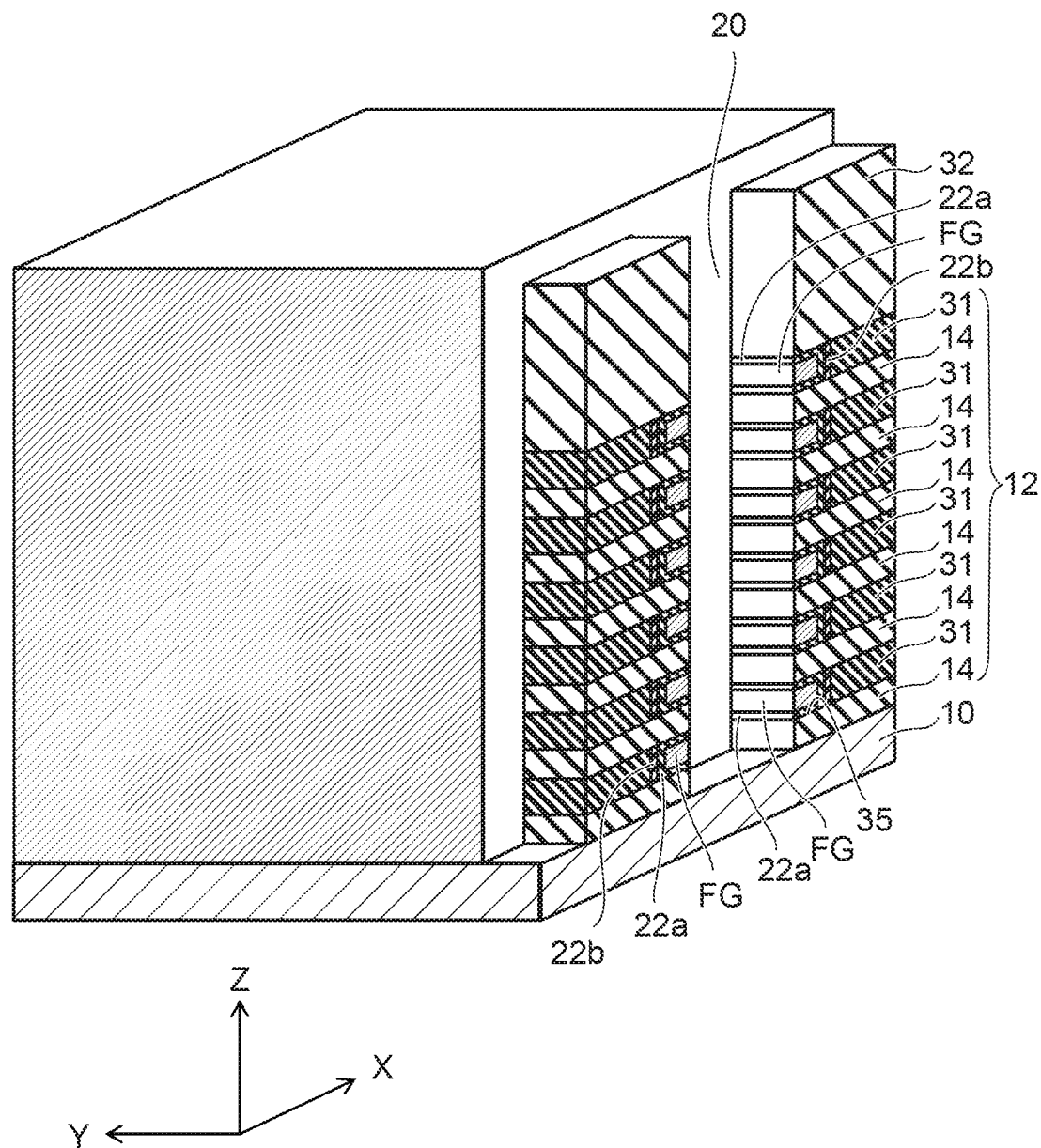
Figure 11A:
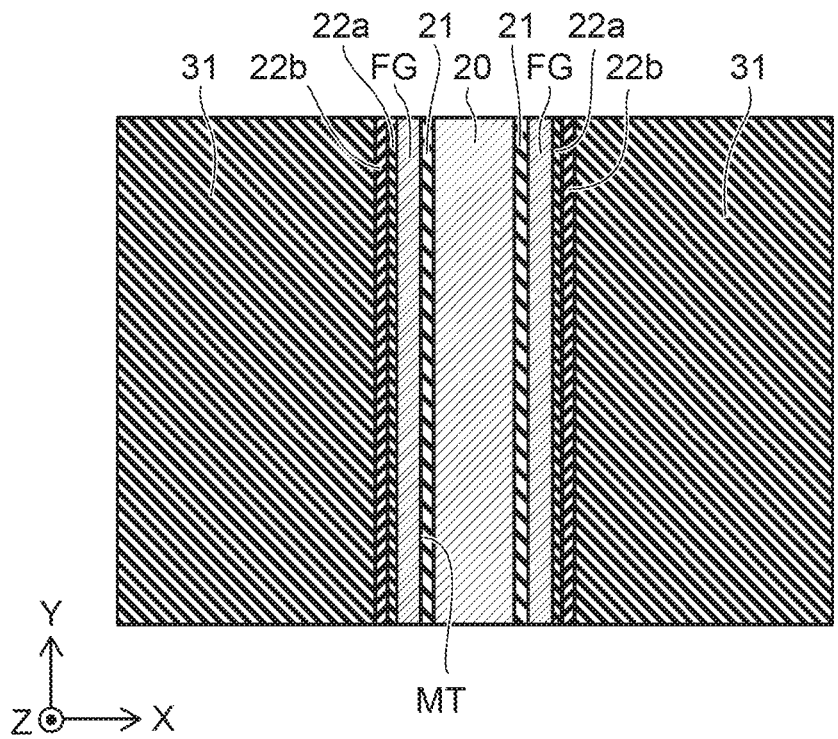
FIGS. 11A to 15 are cross-sectional views illustrating the method for manufacturing the semiconductor memory device according to the first embodiment.
Figure 11B:
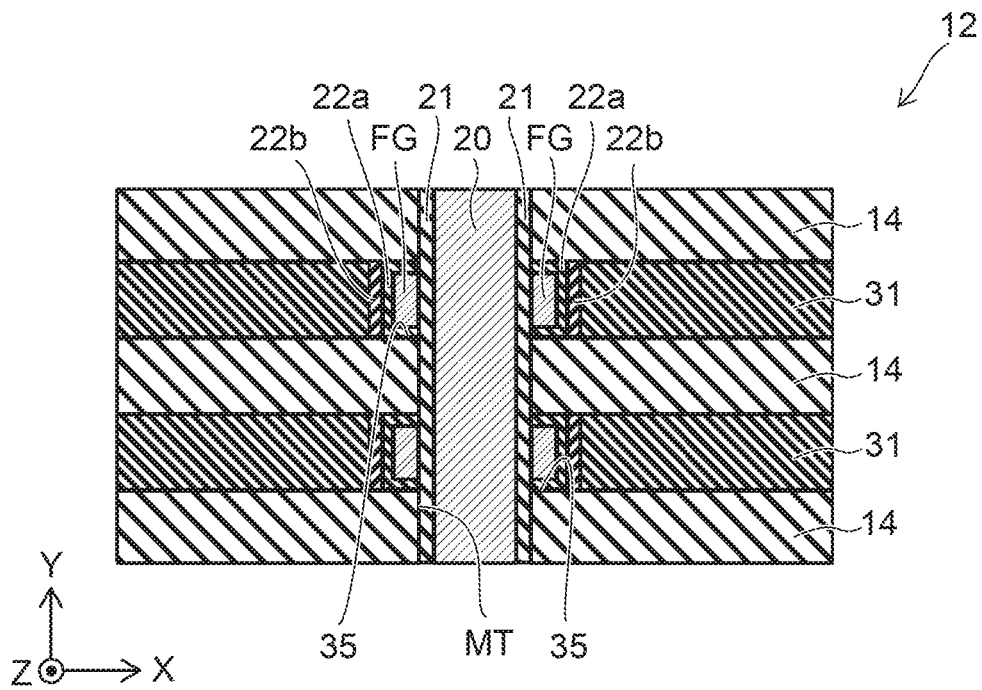

Next, as illustrated in FIGS. 10, 11A, and 11B, the tunnel insulating films 21 are formed on the inner surfaces of the memory trenches MT by depositing silicon oxide, for example. Note that the tunnel insulating films 21 are not illustrated in FIG. 10 for the sake of simplicity. Next, a covering silicon layer is formed on the surfaces of the tunnel insulating films 21 by depositing amorphous silicon. Next, the covering silicon layer and the tunnel insulating films 21 are removed from the bottom faces of the memory trenches MT so as to expose the silicon substrate 10 by carrying out anisotropic etching such as RIE. Amorphous silicon is then deposited to embed the memory trenches MT with a body silicon. The body silicon makes contact with the silicon substrate 10. Next, the covering silicon layer and the body silicon formed of amorphous silicon are subjected to annealing and crystallized, thus forming the semiconductor member 20.

Figure 12:
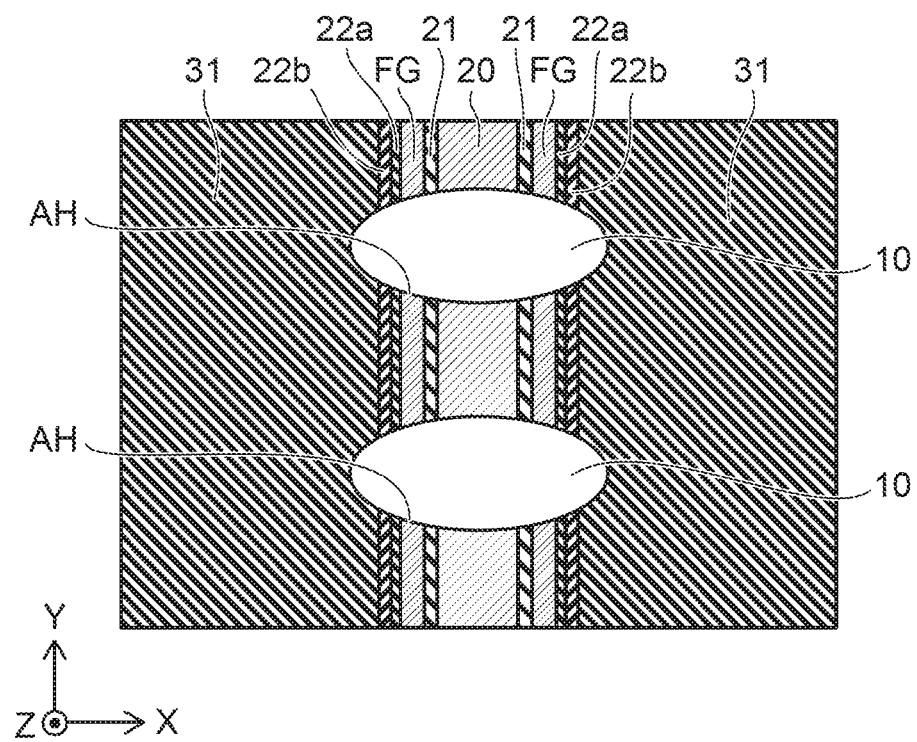

Next, as illustrated in FIG. 12, a plurality of holes AH are formed in the stacked body 12. The shape of each hole AH is, when viewed from the Z-direction, substantially elliptical, taking the X-direction as a major axis direction and the Y-direction as a minor axis direction. The holes AH extend in the Z-direction, passing through the stacked body 12 and reaching the silicon substrate 10. The holes AH are arranged along the memory trenches MT, and the diameter of each hole AH is longer than a distance between the low dielectric constant layers 22b provided on both sides of the memory trenches MT in the X-direction. As a result, the holes AH separate the semiconductor members 20, the tunnel insulating films 21, the floating gate electrodes FG, the high dielectric constant layers 22a, and the low dielectric constant layers 22b along the Y-direction.

Figure 13:
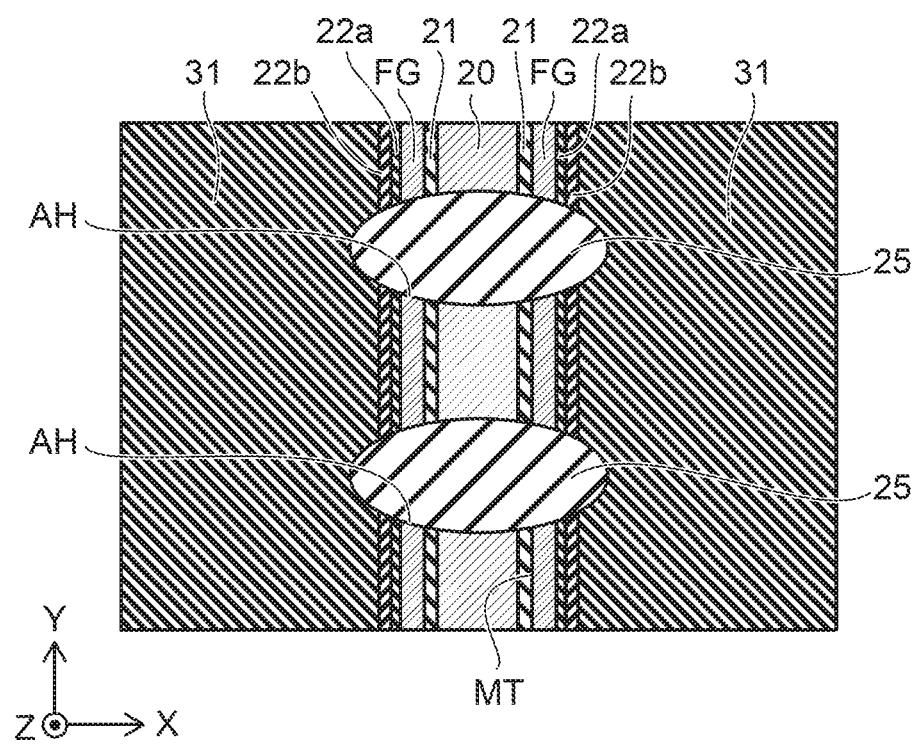

Next, as illustrated in FIG. 13, the insulating members 25 are embedded in the holes AH by depositing silicon oxide.

Figure 14:
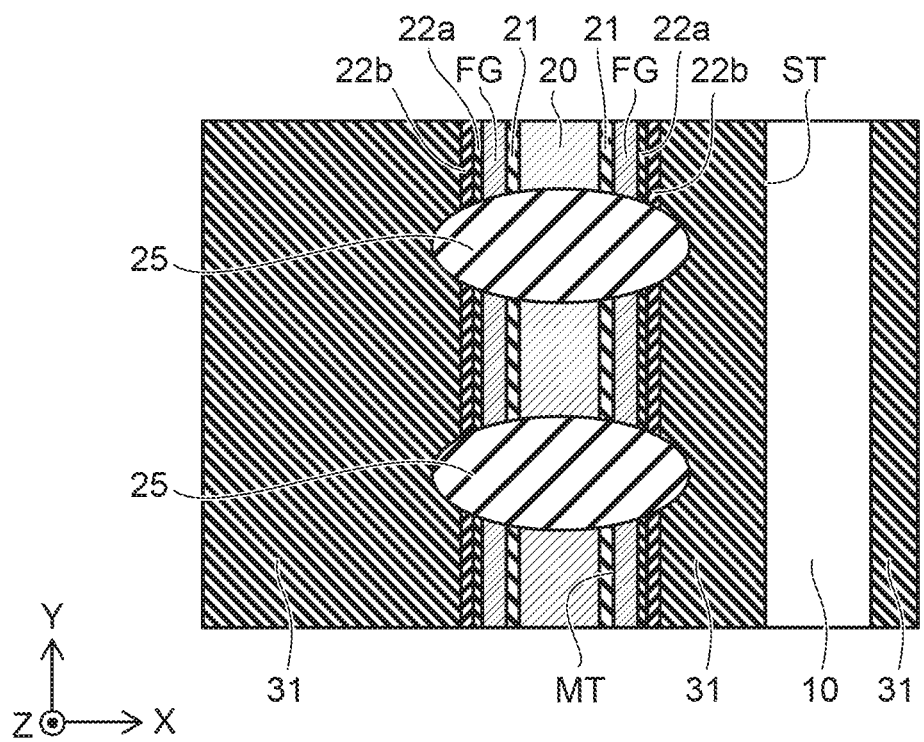

Next, as illustrated in FIG. 14, the slits ST extending in the Y-direction are formed in portions of the stacked body 12 between the memory trenches MT, using lithography and RIE. The slits ST pass through the stacked body 12 in the Z-direction and reach the silicon substrate 10.

Figure 15:
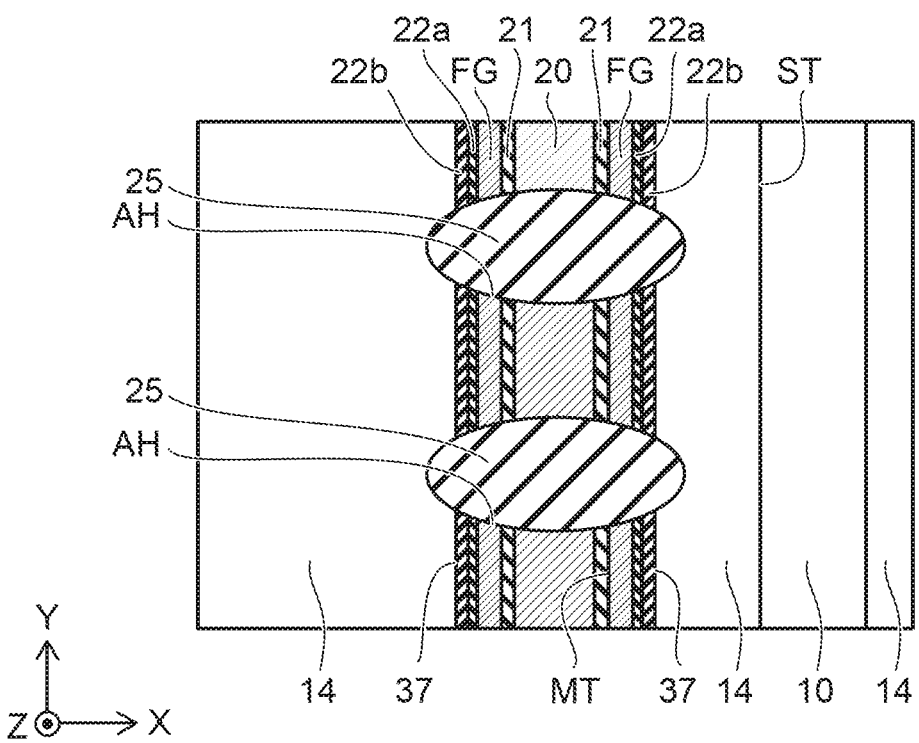

Next, as illustrated in FIG. 15, the remainders of the sacrificial films 31 (see FIG. 14) are removed by etching through the slits ST. For example, wet etching is carried out using hot phosphoric acid. At this time, the low dielectric constant layers 22b function as etching stoppers. As a result, spaces 37 are formed between interlayer insulating films 14 adjacent in the Z-direction.

Next, as illustrated in FIG. 3B, the high dielectric constant layers 22c are formed by depositing a high dielectric constant material, such as hafnium silicon oxide. The high dielectric constant layers 22c make contact with the low dielectric constant layers 22b. The block insulating film 22 is formed by the high dielectric constant layer 22a, the low dielectric constant layer 22b, and the high dielectric constant layer 22c.

Next, a barrier metal layer is formed on the inner surfaces of the slits ST by depositing titanium nitride, for example. Tungsten is then deposited. Next, anisotropic etching such as RIE is carried out to remove portions of the tungsten and the barrier metal layer that have been deposited outside the spaces 37. As a result, the tungsten and the barrier metal layer are separated from space 37 to space 37, and a word line WL is embedded within each space 37. The high dielectric constant layers 22c are also separated from space 37 to space 37. Next, the insulating member 27 is embedded within each slit ST by depositing an insulating material such as, for example, silicon oxide.

Next, as illustrated in FIG. 1, an insulating film (not illustrated) is formed on the stacked body 12, and the vias 28 are formed in the insulating film and connected to the top ends of the semiconductor members 20. Next, the bit line BL extending in the X-direction is formed on this insulating film and is connected to the vias 28. In this manner, the semiconductor memory device 1 according to the embodiment is manufactured.

Next, effects of the embodiment will be described.

In the embodiment, the memory trenches MT are formed in the stacked body 12 in the process illustrated in FIG. 7, and the side surfaces of the memory trenches MT are recessed and embedded with the floating gate electrodes FG and the like in the processes illustrated in FIGS. 8 to 11B. After the semiconductor members 20 and the like are formed within the memory trenches MT, in the processes illustrated in FIGS. 12 and 13, the holes AH are formed, the semiconductor members 20 and the like are separated, and the insulating members 25 are embedded in the holes AH. Accordingly, a maximum width of the structural body 26 in the X-direction can be suppressed to a low width without pulling the floating gate electrodes FG out to both sides of the holes AH in the X-direction. As a result, a minimum width W1 of the word lines WL in the X-direction can be made wider, as illustrated in FIG. 3B. To rephrase, the distance between the memory trenches MT and the slits ST can be reduced while keeping the minimum width W1 of the word lines WL at greater than or equal to a constant value, which makes it possible to increase the level of integration of the semiconductor memory device 1.

Reference Example

Next, a reference example will be described.

Figure 16:
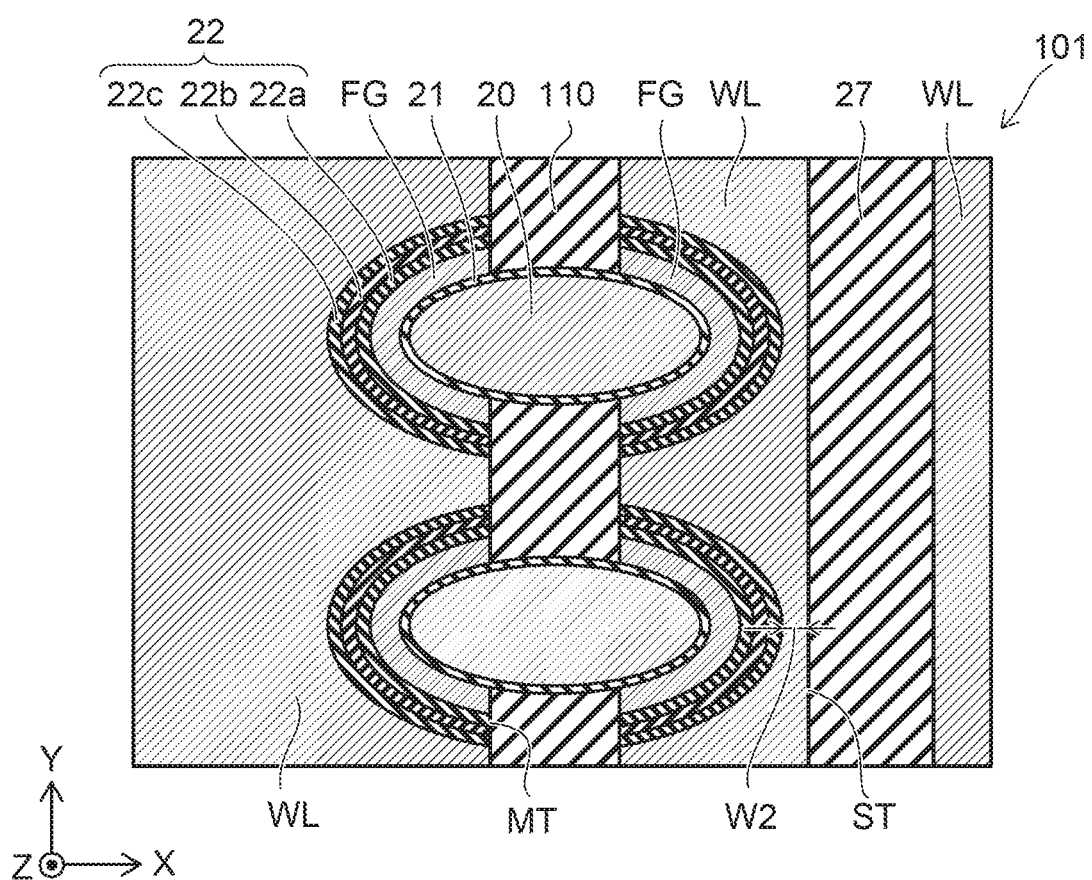
FIG. 16 is a cross-sectional view illustrating a semiconductor memory device according to a reference example.

FIG. 16 is a cross-sectional view illustrating a semiconductor memory device according to the reference example.

As illustrated in FIG. 16, in a semiconductor memory device 101 according to the reference example, insulating members 110 are embedded within the memory trenches MT, the holes AH are formed, and the insulating members 110 are separated. Sacrificial films are recessed through the holes AH and recesses are formed, and the floating gate electrodes FG are formed within these recesses. The semiconductor members 20 are embedded in the holes AH. As a result, the floating gate electrodes FG are pulled out to both sides of the holes AH in the X-direction, and thus a minimum width W2 of the word lines WL becomes shorter than that in the above-described first embodiment (see FIG. 3B). To rephrase, it is necessary to increase the distance between the memory trenches MT and the slits ST in order to keep the minimum width W2 at greater than or equal to a constant value, which results in a drop in the degree of integration of the memory cell.

Second Embodiment

Next, a second embodiment will be described.

Figure 17:
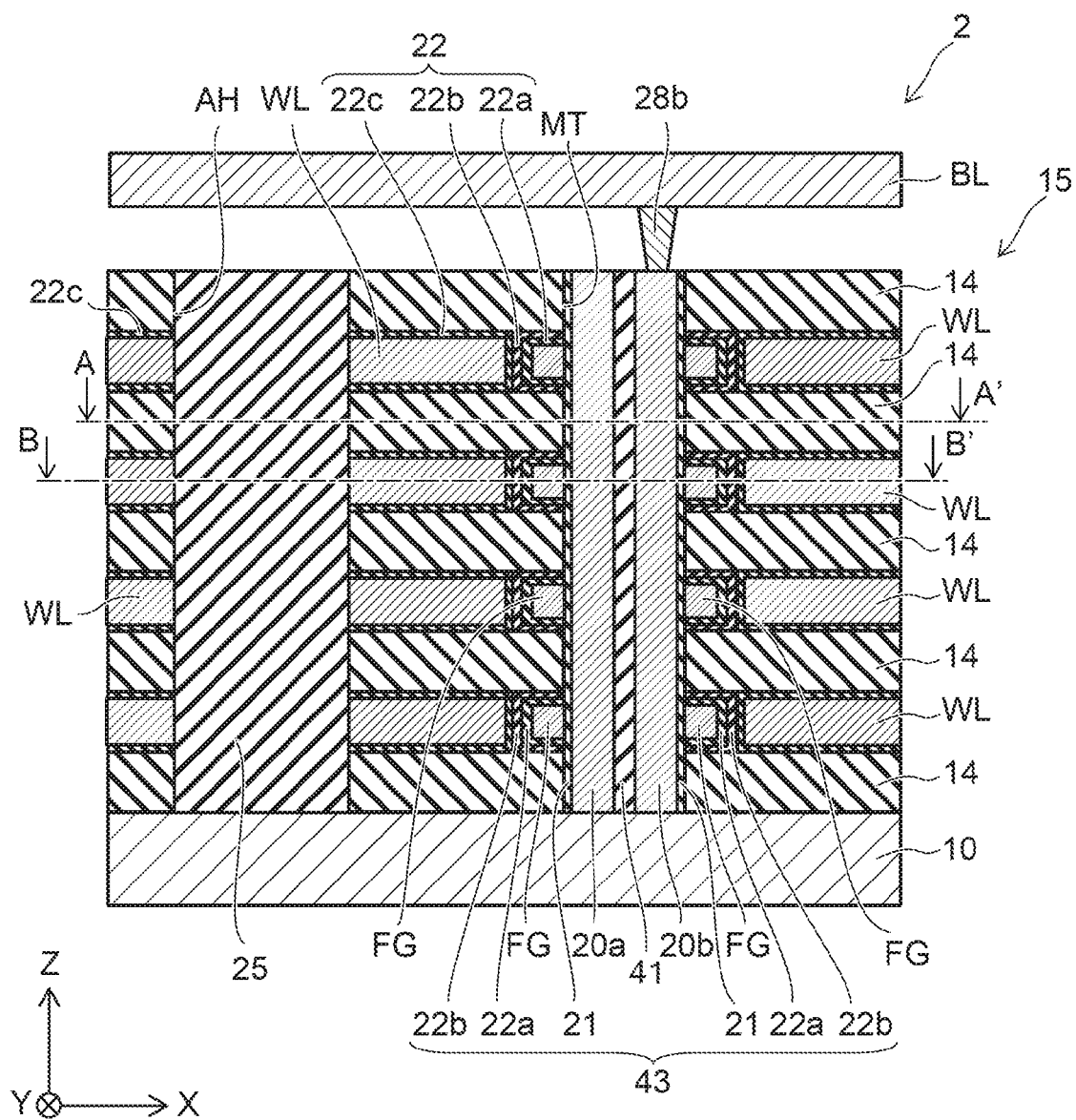
FIG. 17 is a cross-sectional view illustrating a semiconductor memory device according to a second embodiment.

FIG. 17 is a cross-sectional view illustrating a semiconductor memory device according to the embodiment.

FIG. 18A is a cross-sectional view taken from a line A-A' indicated in FIG. 17, and FIG. 18B is a cross-sectional view taken from a line B-B' illustrated in FIG. 17.

FIG. 17 is a cross-sectional view taken from a line C-C' indicated in FIG. 18B.

As illustrated in FIGS. 17, 18A, and 18B, a semiconductor memory device 2 according to the embodiment differs from the above-described semiconductor memory device 1 according to the first embodiment (see FIGS. 1 to 3B) in that the slits ST are not formed in the stacked body 12 and the insulating member 27 is not provided. As will be described later, in the semiconductor memory device 2, a structural body 46, in which a memory cell is formed, and the word lines WL are arranged in an alternating manner along the X-direction, without the insulating member 27 being interposed therebetween. The insulating members 25 included in the structural body 46 make contact with the word lines WL disposed on both sides thereof in the X-direction. Additionally, all of the word lines WL make contact with the insulating members 25 included in the pair of structural bodies 46 disposed on both sides thereof in the X-direction.

In the embodiment, two semiconductor members 20a and 20b are provided instead of the one semiconductor member 20 (see FIG. 2). The semiconductor member 20a and the semiconductor member 20b extend in the Z-direction and are separated from each other in the X-direction. An insulating member 41 formed of silicon oxide, for example, is provided between the semiconductor member 20a and the semiconductor member 20b. The shape of the insulating member 41 is a band shape that takes the Z-direction as a lengthwise direction, the Y-direction as a widthwise direction, and the X-direction as a thickness direction.

In the embodiment, vias 28a are provided in a region immediately above the semiconductor member 20a, and vias 28b are provided in a region immediately above the semiconductor member 20b. The semiconductor members 20a and 20b are connected to mutually different bit lines BL by the vias 28a and 28b, respectively. The semiconductor member 20a and the semiconductor member 20b adjacent in the X-direction with the word line WL therebetween are also connected to mutually different bit lines BL.

In the semiconductor memory device 2 according to the embodiment, the position of the block insulating film 22 is different from that in the first embodiment. This point will be described hereinafter. The high dielectric constant layer 22a of the block insulating film 22 is provided on the floating gate electrodes FG, on the upper surfaces, the lower surfaces, and the side surfaces facing the word lines WL. The low dielectric constant layer 22b is provided on the high dielectric constant layer 22a, on the upper surfaces, the lower surfaces, and the side surfaces facing the word lines WL.

A column-shaped body 43 is formed by a single insulating member 41, the semiconductor members 20a and 20b disposed on both sides thereof in the X-direction, the tunnel insulating films 21 disposed on both sides thereof in the X-direction, the floating gate electrodes FG disposed on both sides thereof in the X-direction, and the high dielectric constant layer 22a and low dielectric constant layer 22b provided on the surfaces thereof. The high dielectric constant layer 22c is provided between the column-shaped body 43 and the word lines WL, between the column-shaped body 43 and the insulating members 25, and between the interlayer insulating films 14 and the insulating members 25. However, the high dielectric constant layers 22c adjacent in the Y-direction do not make contact with each other, and the insulating members 25 make contact with the word lines WL in a gap between the high dielectric constant layers 22c adjacent in the Y-direction.

The structural body 46 is formed by the column-shaped bodies 43 and insulating members 25 arranged in an alternating manner along the Y-direction, and by the block insulating film 22. The shape of the structural body 46 is a plate-like shape that spreads out along the YZ plane. A plurality of the structural bodies 46 are provided in the stacked body 12, and separated from each other in the X-direction. A plurality of the word lines WL, extending in the Y-direction and separated from each other along the Z-direction, are provided between structural bodies 46 adjacent in the X-direction. The insulating member 25 makes contact, on both sides thereof in the X-direction, with all of the plurality of word lines WL arranged along the Z-direction.

Next, a method for manufacturing the semiconductor memory device according to the embodiment will be described.

FIGS. 19A to 25B are cross-sectional views illustrating a method for manufacturing the semiconductor memory device according to the embodiment.

Figure 19A:
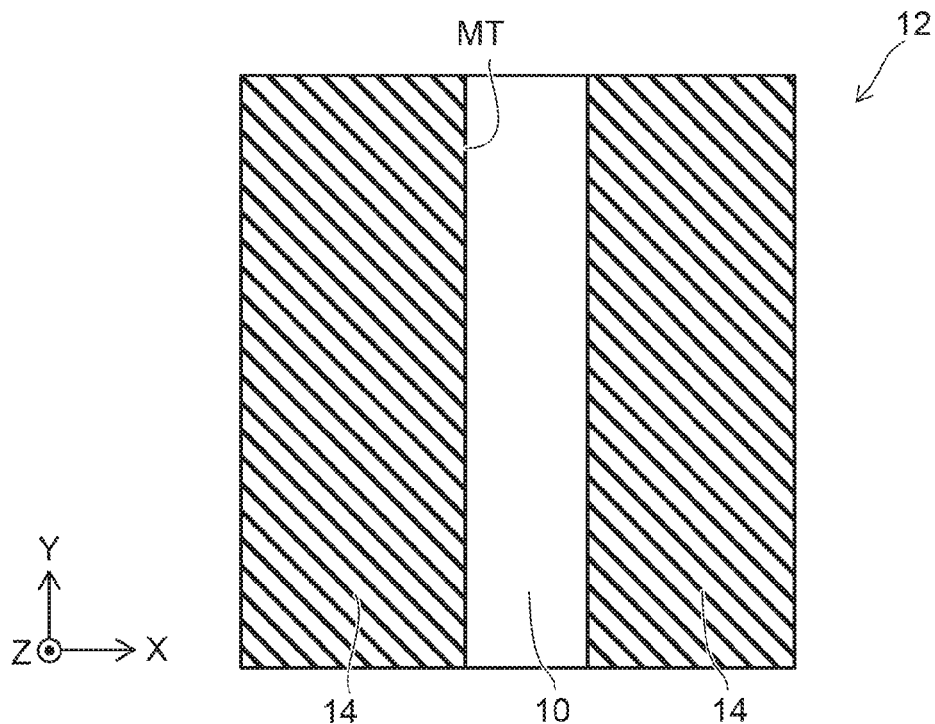
FIGS. 19A to 25B are cross-sectional views illustrating a method for manufacturing a semiconductor memory device according to the second embodiment.
Figure 19B:
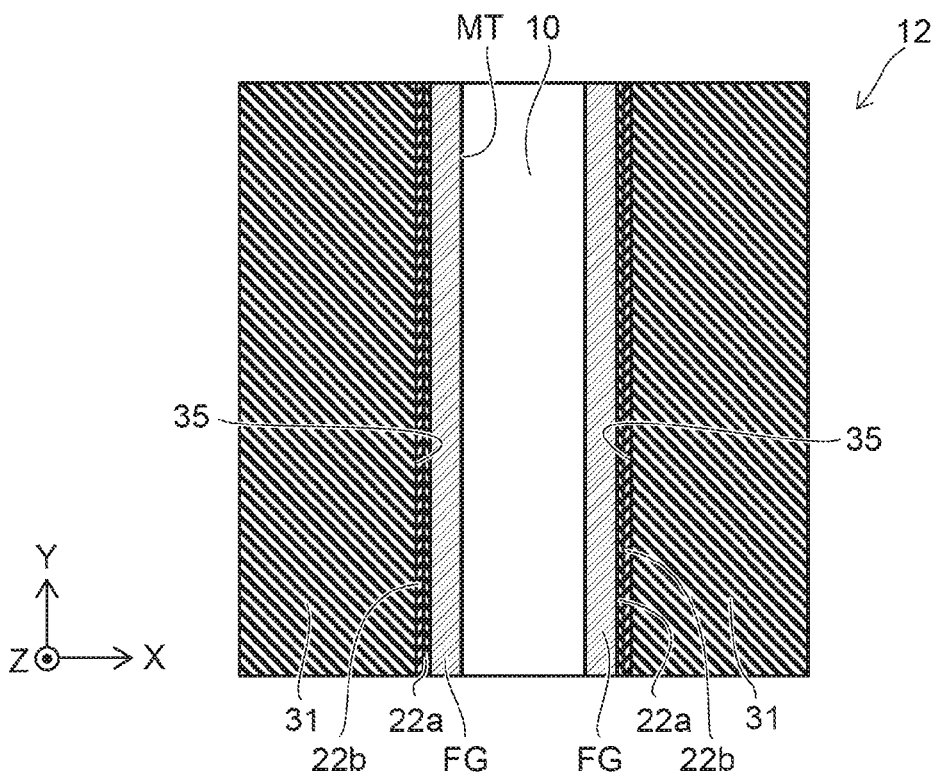

FIG. 19A illustrates a region corresponding to FIG. 18A, and FIG. 19B illustrates a region corresponding to FIG. 18B. The same applies to FIGS. 20A to 25B.

First, the processes illustrated in FIGS. 4 to 7 are carried out so as to form the plurality of memory trenches MT extending in the Y-direction and arranged along the X-direction in the stacked body 12 (see FIGS. 18A and 18B).

Next, as illustrated in FIGS. 19A and 19B, etching is carried out over the memory trenches MT to remove part of the sacrificial films 31 and form the recesses 35 in the side surfaces of the memory trenches MT. Next, silicon oxide is deposited to form the low dielectric constant layer 22b on the inner surfaces of the memory trenches MT and the recesses 35. Note that at this time, the low dielectric constant layer 22b may be formed on the back surface of each of the recesses 35 by oxidizing the sacrificial films 31, as in the above-described first embodiment. Next, the high dielectric constant layer 22a is formed on the inner surfaces of the memory trenches MT and the recesses 35 by depositing hafnium silicon oxide (HfSiO), for example. Next, the floating gate electrodes FG are formed in the recesses 35 by depositing silicon and then etching back the silicon.

Figure 20A:
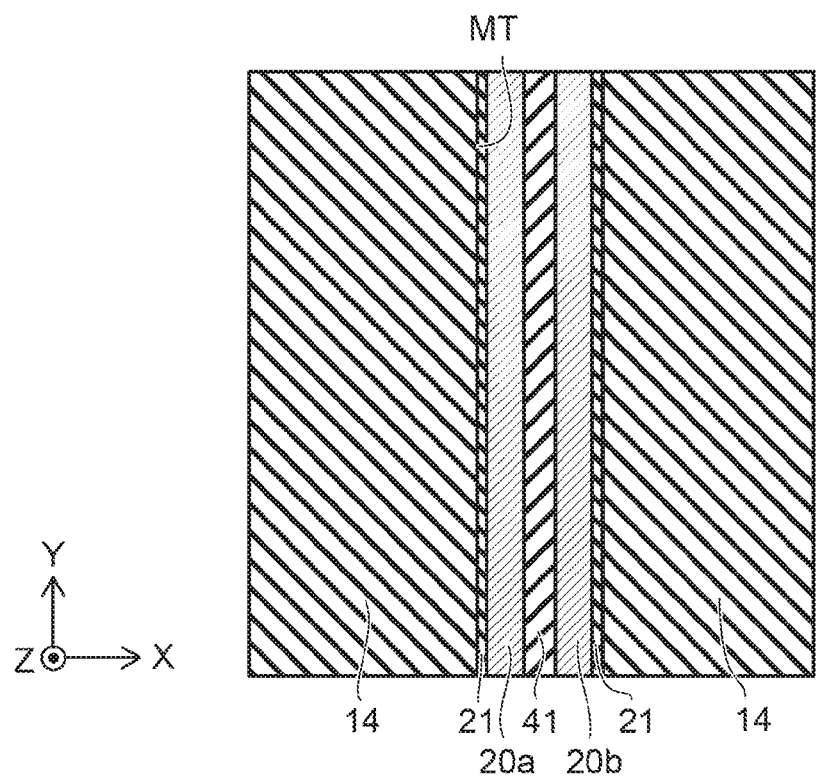
Figure 20B:
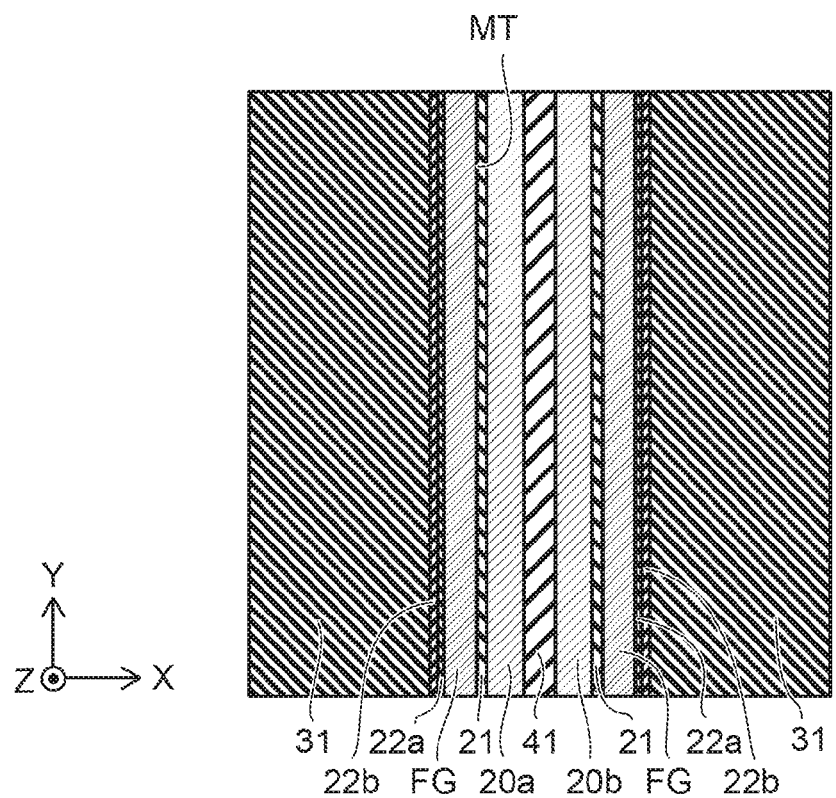

Next, as illustrated in FIGS. 20A and 20B, the tunnel insulating film 21 and a silicon film are formed on the inner surfaces of the memory trenches MT. Next, the silicon film and the tunnel insulating film 21 are etched back and removed from the bottom faces of the memory trenches MT. As a result, the semiconductor members 20a and 20b made from silicon are formed on the side surfaces of the tunnel insulating films 21, on both side surfaces of the memory trenches MT. Next, the insulating members 41 are embedded between the semiconductor member 20a and the semiconductor member 20b by depositing silicon oxide.

Figure 21A:
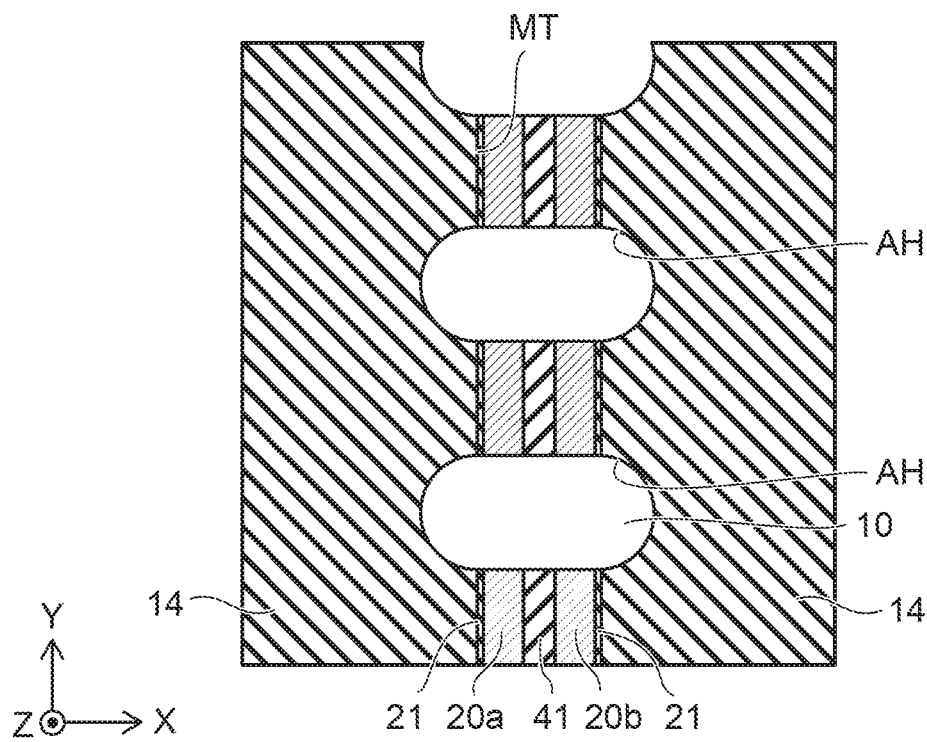
Figure 21B:
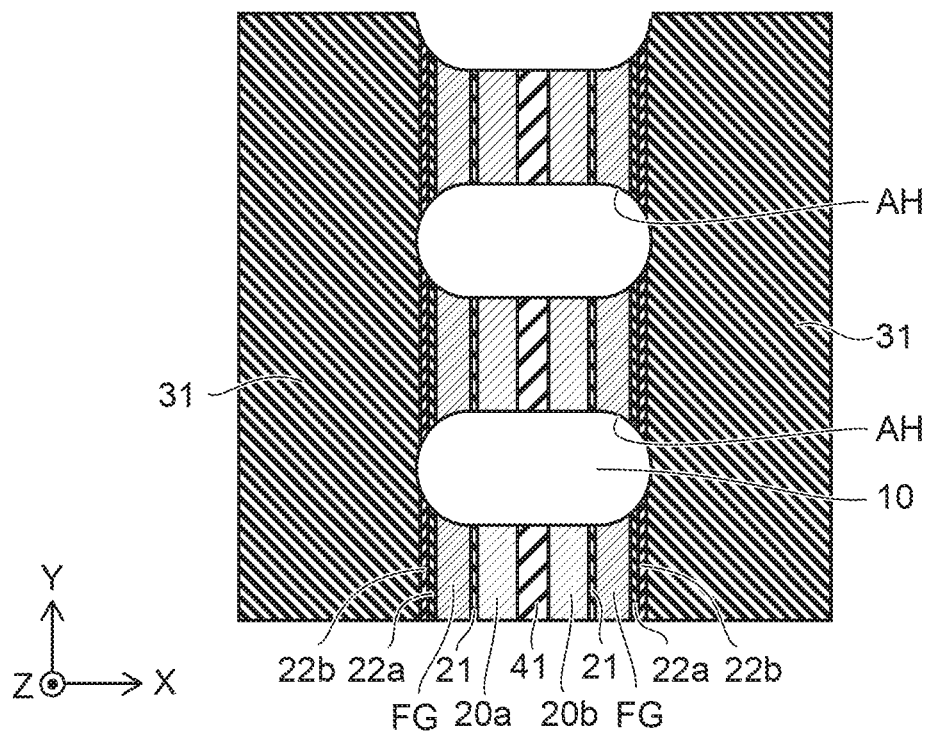

Next, as illustrated in FIGS. 21A and 21B, a plurality of the holes AH are formed in the stacked body 12. The shape of each hole AH is, when viewed from the Z-direction, substantially elliptical, taking the X-direction as a major axis direction and the Y-direction as a minor axis direction. The holes AH are arranged along the memory trenches MT, and the diameter of each hole AH is longer than a distance between the low dielectric constant layers 22b provided on both sides of the memory trenches MT in the X-direction. As a result, the holes AH separate the insulating members 41, the semiconductor members 20a and 20b, the tunnel insulating films 21, the floating gate electrodes FG, the high dielectric constant layers 22a, and the low dielectric constant layers 22b along the Y-direction.

Figure 22A:
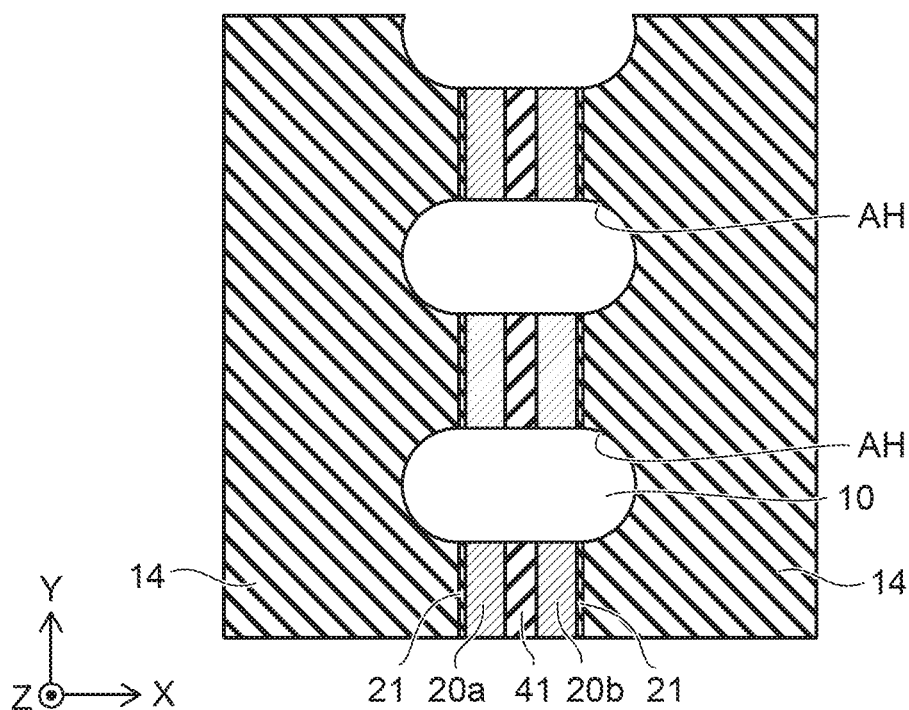
Figure 22B:
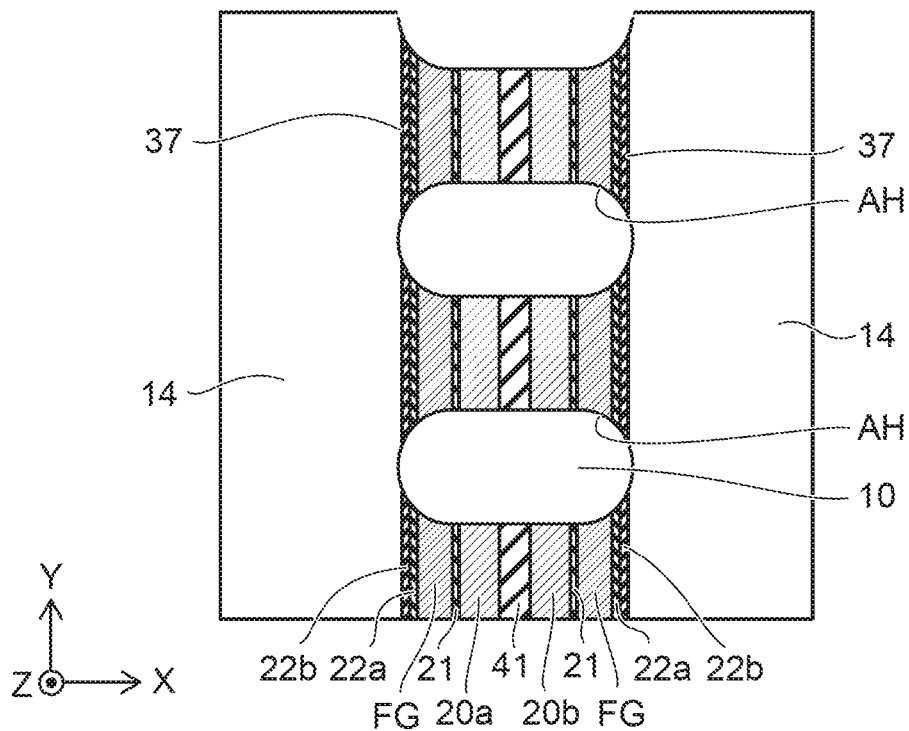

Next, as illustrated in FIGS. 22A and 22B, the remainders of the sacrificial films 31 (see FIG. 21B) are removed by etching through the holes AH. As a result, the spaces 37 are formed between interlayer insulating films 14 adjacent in the Z-direction.

Figure 23A:
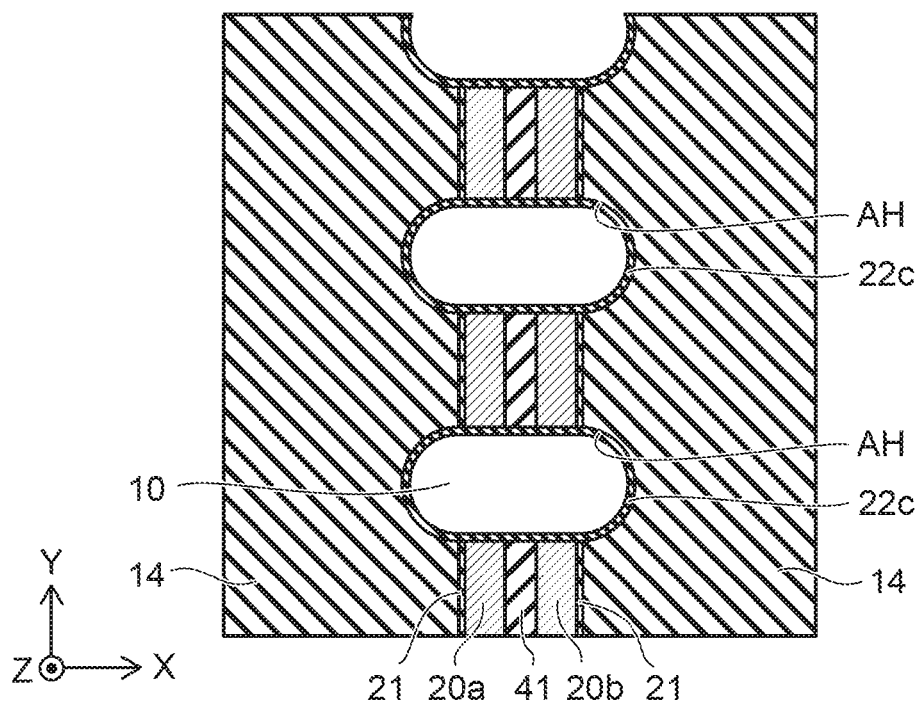
Figure 23B:
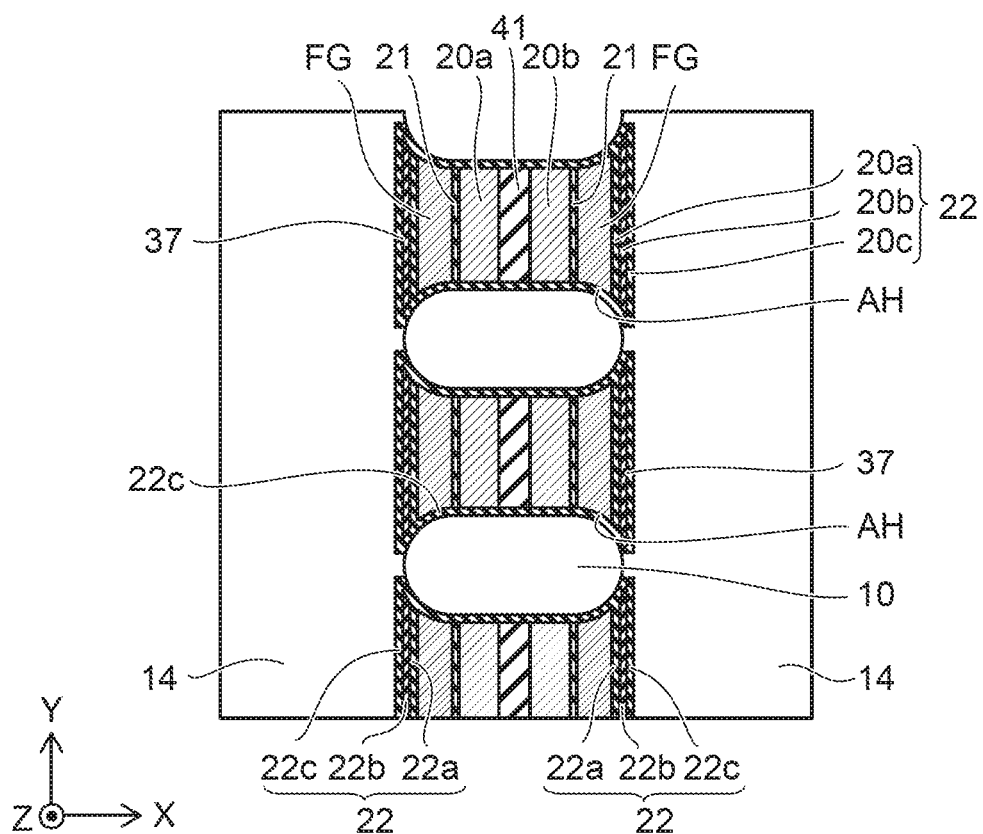

Next, as illustrated in FIGS. 23A and 23B, the high dielectric constant layer 22c is formed by depositing a high dielectric constant material, such as hafnium silicon oxide. The high dielectric constant layer 22c is formed substantially uniformly on the inner surfaces of the holes AH and the spaces 37. The block insulating film 22 is formed by the high dielectric constant layer 22a, the low dielectric constant layer 22b, and the high dielectric constant layer 22c.

Figure 24A:
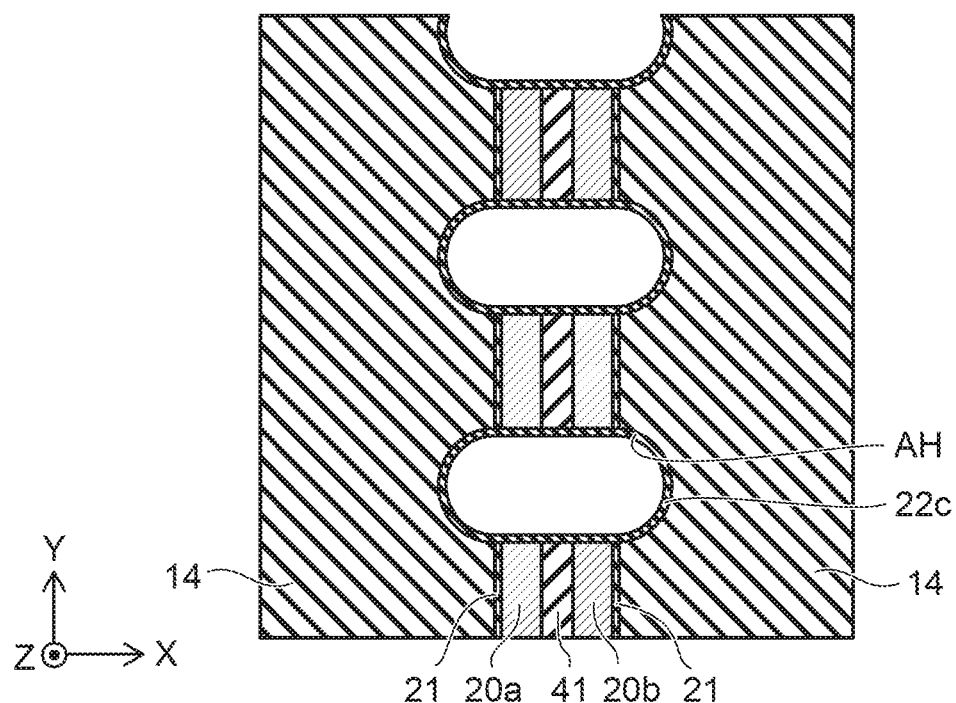
Figure 24B:
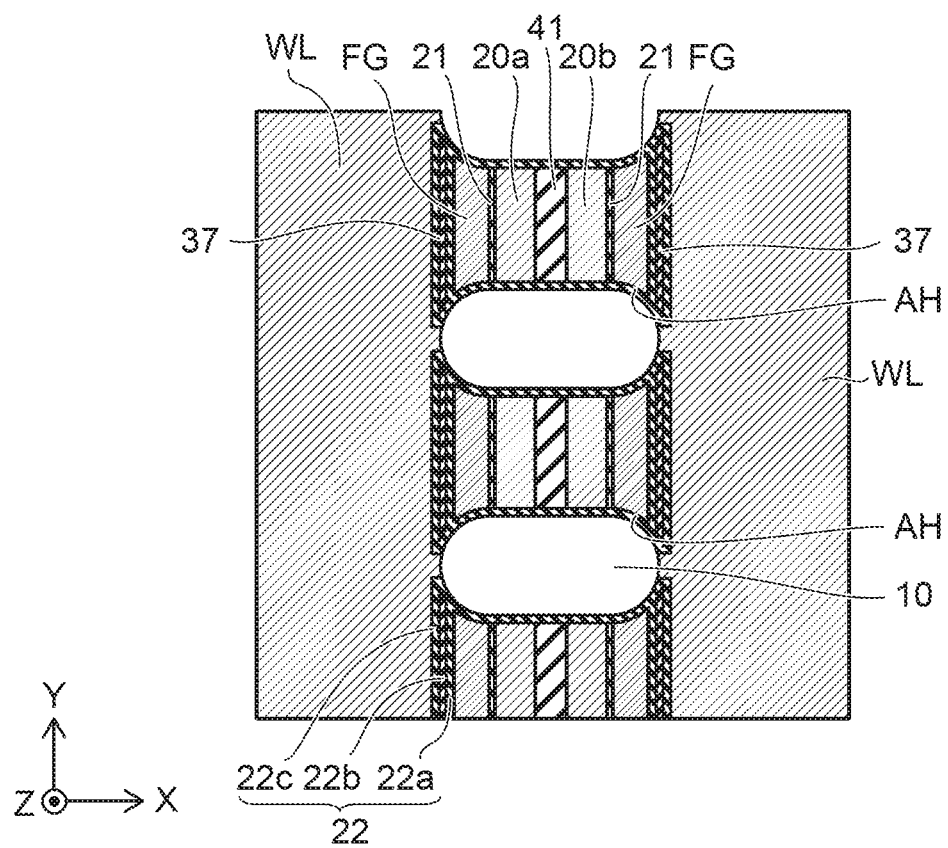

Next, as illustrated in FIGS. 24A and 24B, a barrier metal layer is formed on the inner surfaces of the holes AH and the spaces 37 by depositing titanium nitride, for example, through the holes AH. Next, tungsten is deposited through the holes AH. Next, anisotropic etching such as RIE is carried out to remove portions of the tungsten and the barrier metal layer that have been deposited in the holes AH. As a result, the tungsten and the barrier metal layer are separated from space 37 to space 37, and a word line WL is embedded within each space 37.

Figure 25A:
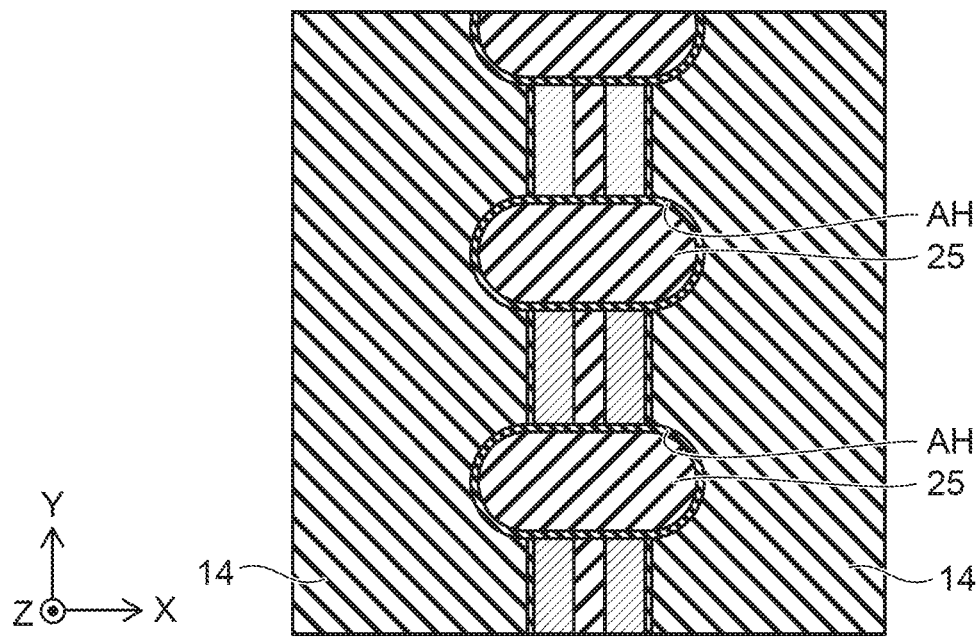
Figure 25B:
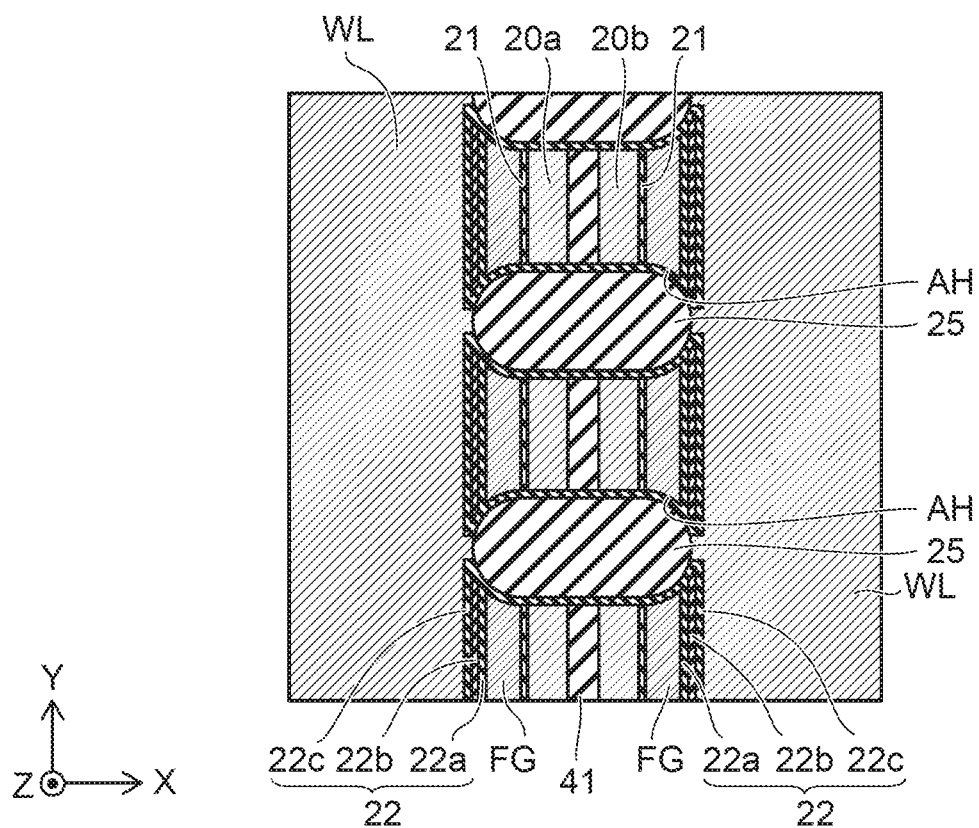

Next, as illustrated in FIGS. 25A and 25B, the insulating members 25 are embedded within the holes AH by depositing an insulating material such as silicon oxide. The insulating members 25 make contact with the word lines WL. Next, the vias 28a and 28b are formed and the bit lines BL are formed through the same process as that in the above-described first embodiment. In this manner, the semiconductor memory device 2 according to the embodiment is manufactured.

Next, effects of the embodiment will be described.

According to the embodiment, the holes AH are formed in the processes illustrated in FIGS. 22A and 22B, and the sacrificial films 31 are replaced with the word lines WL through the holes AH in the processes illustrated in FIGS. 23A to 24B. As a result, it is not necessary to form the slits ST, which makes it possible to shorten an arrangement period of the memory trenches MT in the X-direction and increase the level of integration in the memory cell.

Additionally, according to the embodiment, the semiconductor member 20a and the semiconductor member 20b in each column-shaped body 43 are isolated by the insulating member 41 and are connected to different bit lines BL. The semiconductor member 20a and the semiconductor member 20b adjacent in the X-direction with the word line WL therebetween are also connected to mutually different bit lines BL. As a result, in a given XY plane, a single memory cell is formed by each of the semiconductor members 20a and 20b, and thus mutually independent bit line potentials can be applied to semiconductor members 20a and 20b adjacent with the insulating member 41 therebetween and to semiconductor members 20a and 20b adjacent with the word line WL therebetween. As a result, the memory cells can be driven independent from one another.

The configuration, manufacturing method, and effects of the embodiment other than those described above are the same as in the above-described first embodiment.

Third Embodiment

Next, a third embodiment will be described.

Figure 26A:
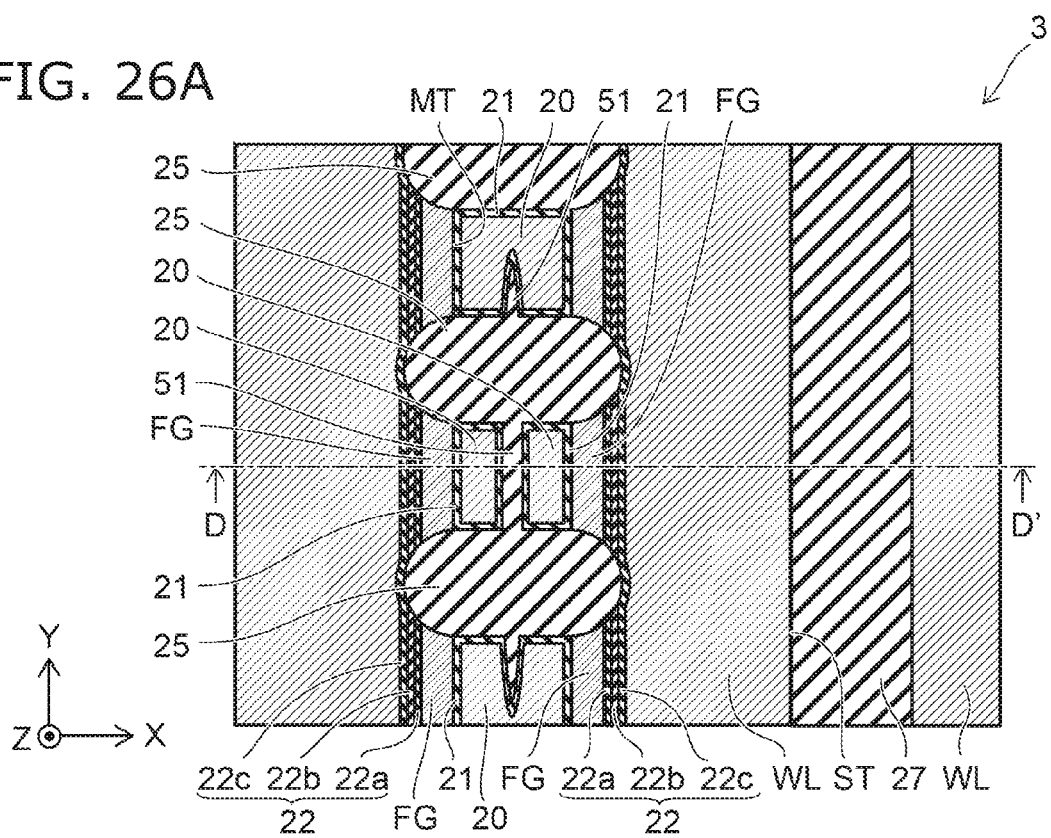
FIGS. 26A and 26B are cross-sectional views illustrating a semiconductor memory device according to a third embodiment.
Figure 26B:
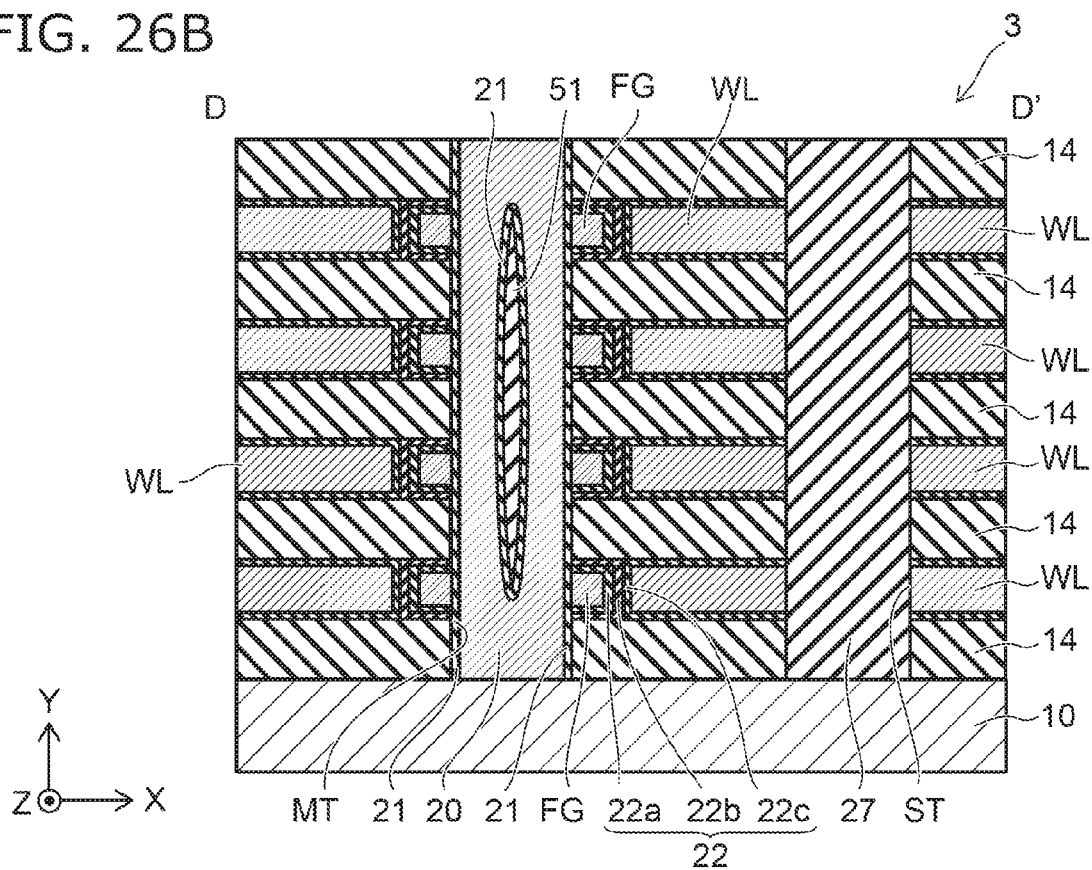

FIGS. 26A and 26B are cross-sectional views illustrating a semiconductor memory device according to the embodiment.

FIG. 26B is a cross-sectional view taken from a line D-D' indicated in FIG. 26A.

As illustrated in FIGS. 26A and 26B, a semiconductor memory device 3 according to the embodiment differs from the above-described semiconductor memory device 1 according to the first embodiment (see FIGS. 1 to 3B) in that insulating members 51 extending in the Y-direction are provided in the memory trenches MT. Each insulating member 51 passes through at least one semiconductor member 20 in the Y-direction, and is integrally linked to two insulating members 25 disposed on both sides of that semiconductor member 20 in the Y-direction. The insulating members 51 may pass through a plurality of semiconductor members 20 arranged along the Y-direction. However, the insulating members 51 pass through the semiconductor members 20 neither in the X-direction nor in the Z-direction. There may be semiconductor members 20 in which the insulating members 51 are not provided.

In the semiconductor memory device 3, the tunnel insulating film 21 is provided between the semiconductor members 20 and the insulating members 25 and between the semiconductor members 20 and the insulating members 51 in addition to between the semiconductor members 20 and the floating gate electrodes FG.

Next, a method for manufacturing the semiconductor memory device according to the embodiment will be described.

FIGS. 27A to 35B are views illustrating a method for manufacturing the semiconductor memory device according to the embodiment.

Figure 27A:
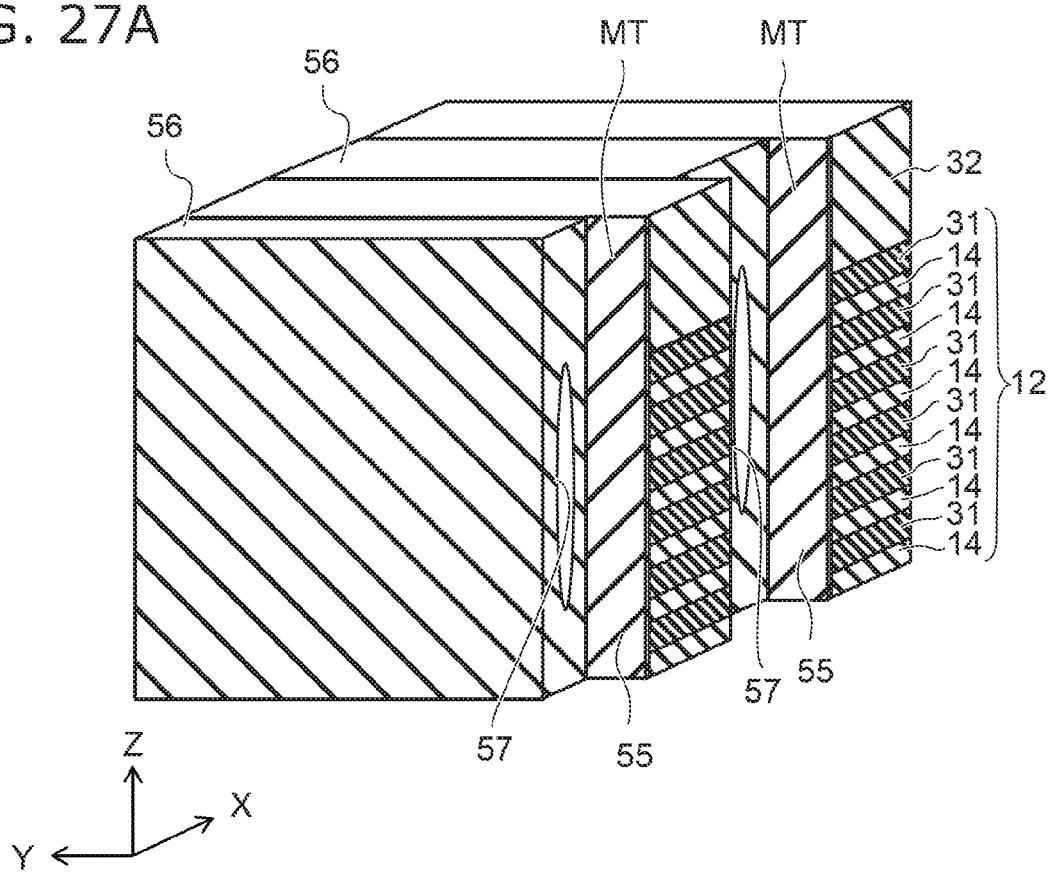
FIGS. 27A to 35B are views illustrating a method for manufacturing a semiconductor memory device according to the third embodiment.
Figure 27B:
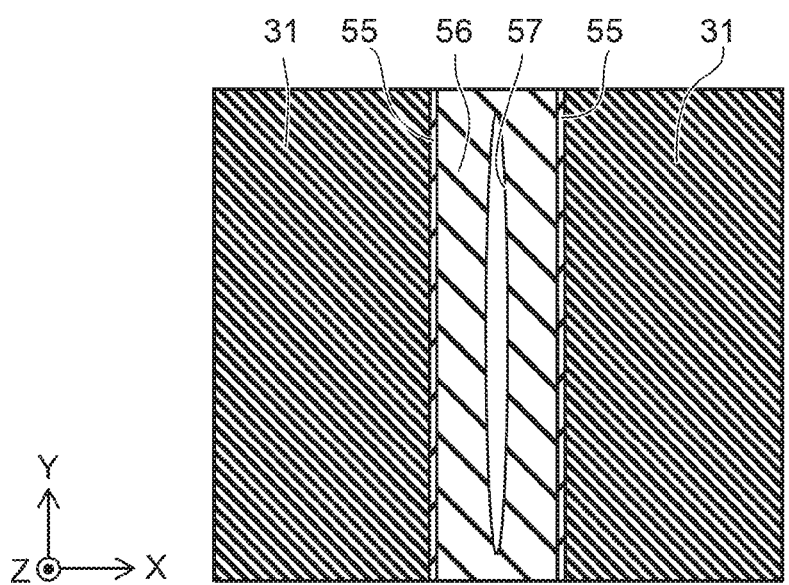

FIGS. 27A and 27B illustrate the same process, where FIG. 27A is a perspective view and FIG. 27B is a cross-sectional view. The same applies to FIGS. 28A to 35B.

First, the processes illustrated in FIGS. 4 to 7 are carried out so as to form the plurality of memory trenches MT extending in the Y-direction and arranged along the X-direction in the stacked body 12. At this time, the memory trenches MT may have a bowing shape protruding in the X-direction at intermediate areas in the Z-direction.

Next, as illustrated in FIGS. 27A and 27B, the sacrificial films 31 exposed on the side surfaces of the memory trenches MT are oxidized by carrying out a radical oxidation process such as in-situ steam generation (ISSG) oxidation or plasma oxidation, thus forming a stopper film 55 made from silicon oxide. Next, a sacrificial material 56 is embedded in the memory trenches MT by depositing silicon nitride through CVD using hexachlorosilane (HCD), for example, as a raw material. At this time, seams 57 extending in the Y-direction are formed in the sacrificial material 56. The seams 57 form with particular ease when the memory trenches MT have such a bowing shape.

Figure 28A:
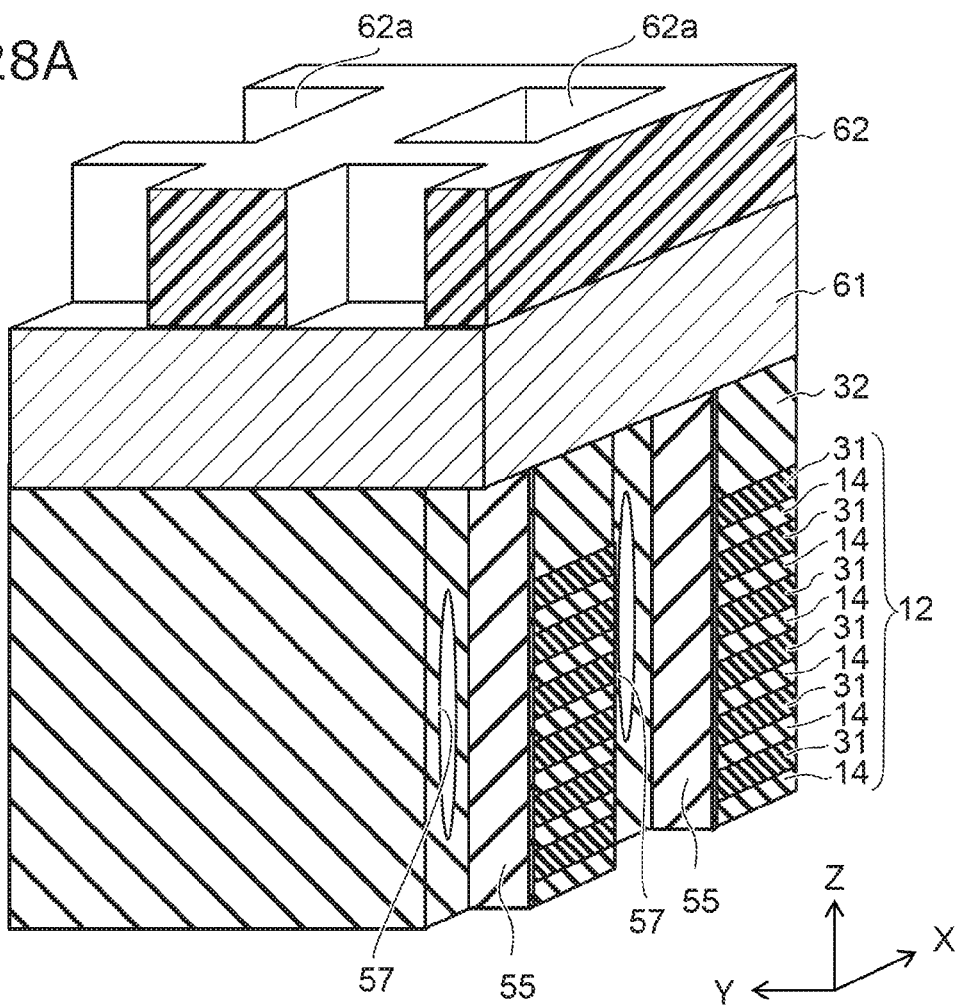
Figure 28B:
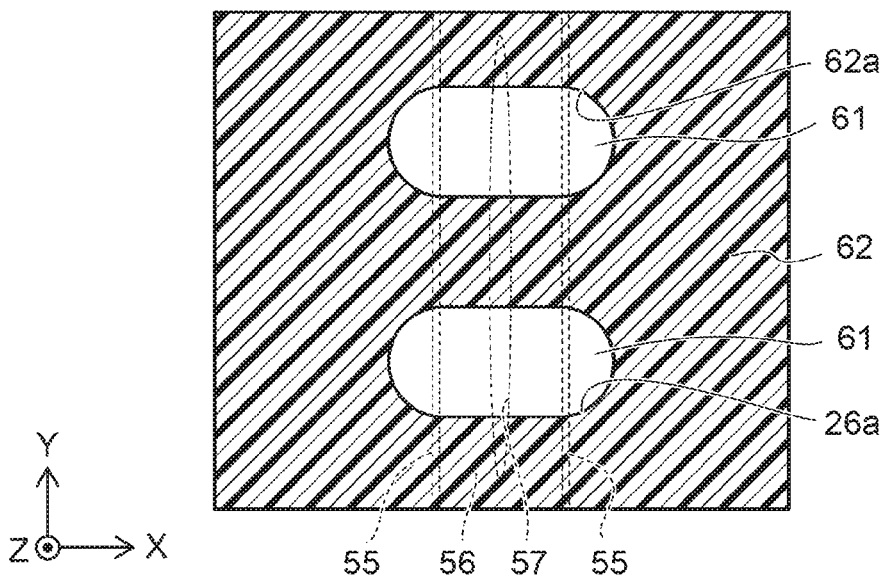

Next, as illustrated in FIGS. 28A and 28B, a hard mask film 61 containing carbon and an antireflective film (not illustrated) are formed on the stacked body 12. Next, a resist film is formed, and a resist pattern 62 is then formed by patterning through lithography. Substantially elliptical openings 62a that take the X-direction as a major axis direction are formed in the resist pattern 62. Note that the openings 62a are illustrated as being quadrangular in shape in FIG. 28A for the sake of simplicity.

Figure 29A:
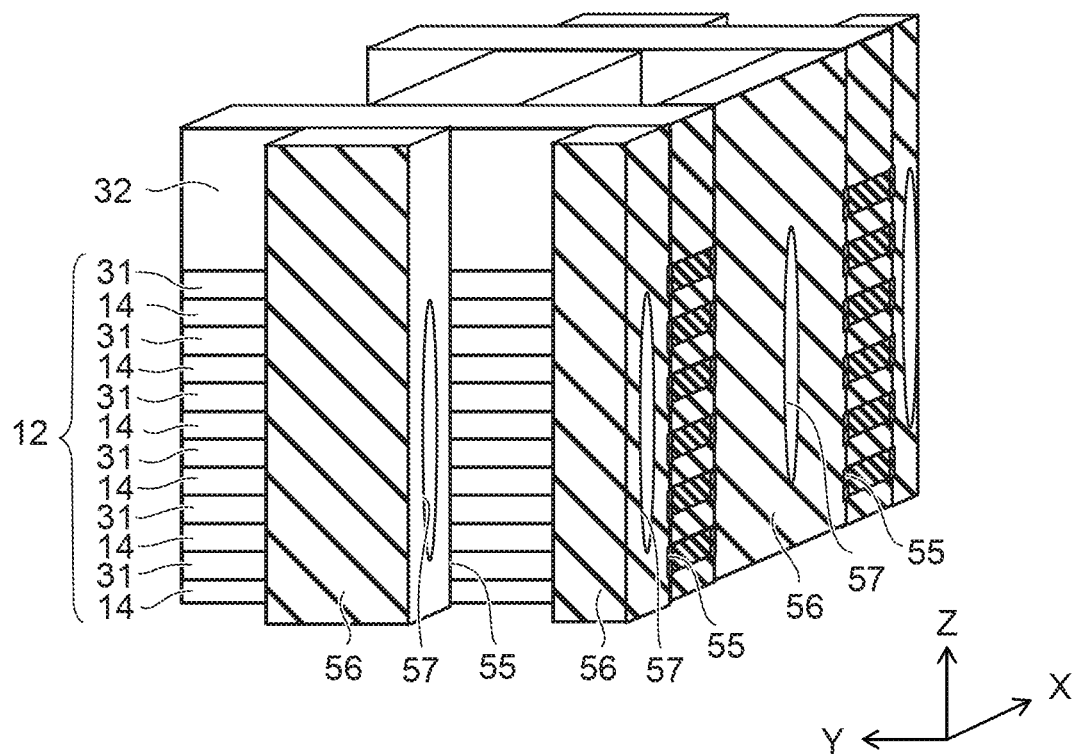
Figure 29B:
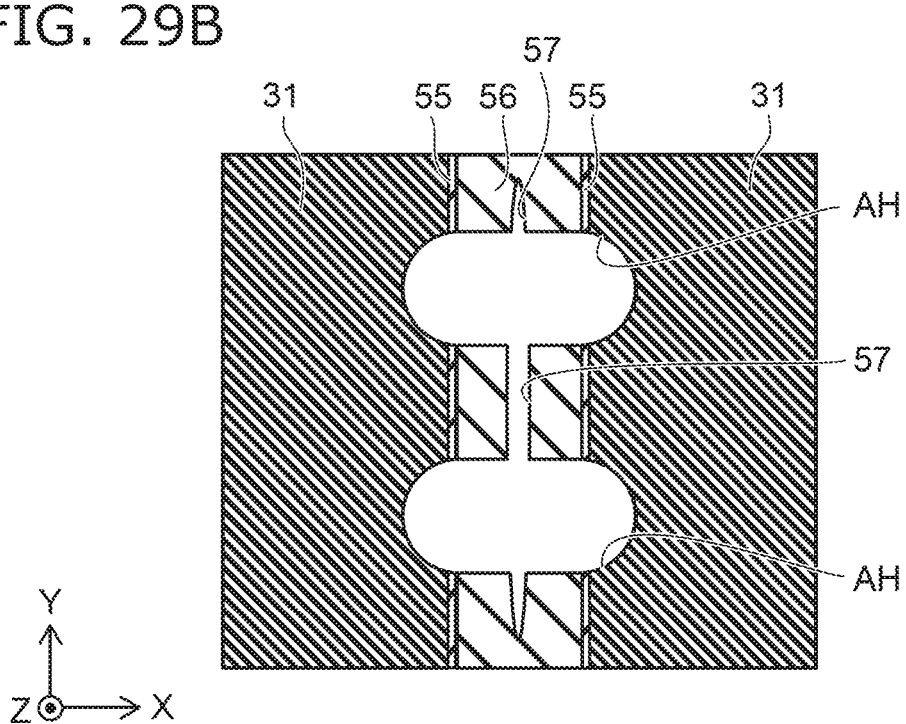

Next, anisotropic etching such as RIE is performed, as illustrated in FIGS. 29A and 29B. As a result, portions of the interlayer insulating film 14, the sacrificial film 31, the stopper film 55, and the sacrificial material 56 disposed immediately below the openings 62a are removed, and the holes AH reaching the silicon substrate 10 (see FIG. 26B) are formed in the stacked body 12. The sacrificial material 56 and the stopper film 55 are separated in the Y-direction as a result. The embodiment assumes that each seam 57 is connected to at least two of the holes AH adjacent in the Y-direction.

It is favorable that the holes AH be formed as perpendicular as possible and that the seams 57 do not expand. Making the processing as perpendicular as possible does increase the likelihood of the silicon substrate 10 (see FIG. 26B) being deeply engraved, but this is not a problem because the insulating members 25 will ultimately be embedded in the holes AH.

Figure 30A:
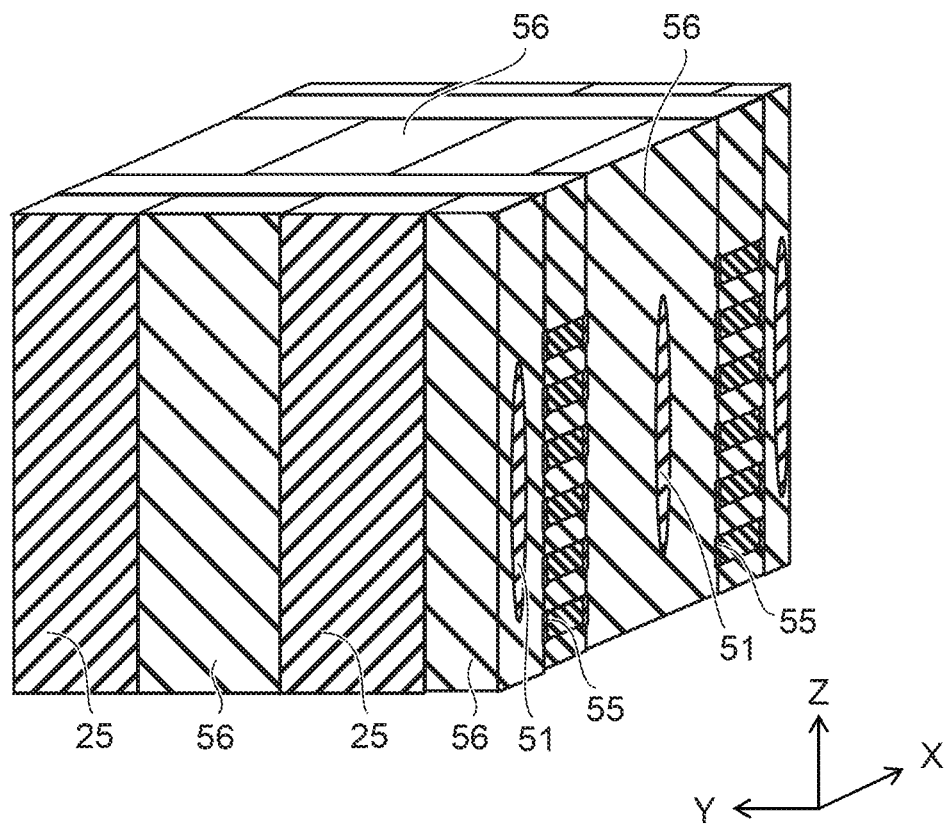
Figure 30B:
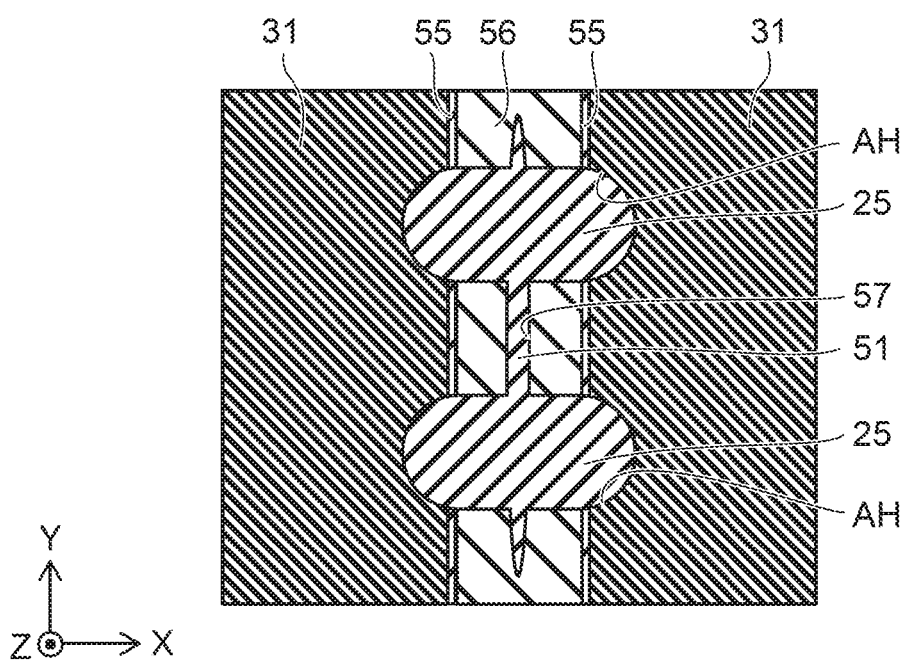

Next, silicon oxide is deposited as illustrated in FIGS. 30A and 30B. The insulating members 25 are embedded in the holes AH and the insulating members 51 are embedded in the seams 57 as a result. The insulating members 25 and the insulating members 51 are formed integrally. The insulating members 25 and the insulating members 51 are not processed in subsequent processes, and thus it is not a problem if seams, voids, or the like are formed therein. Accordingly, the silicon oxide may be deposited through low pressure chemical vapor deposition (LP-CVD) or atomic layer deposition (ALD).

Figure 31A:
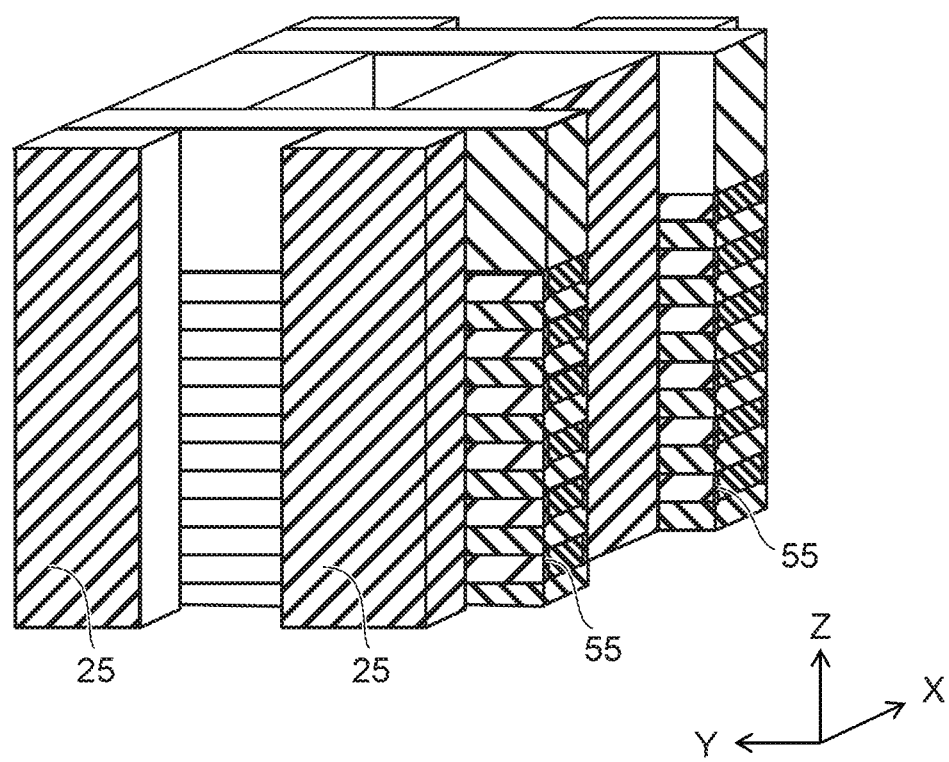
Figure 31B:
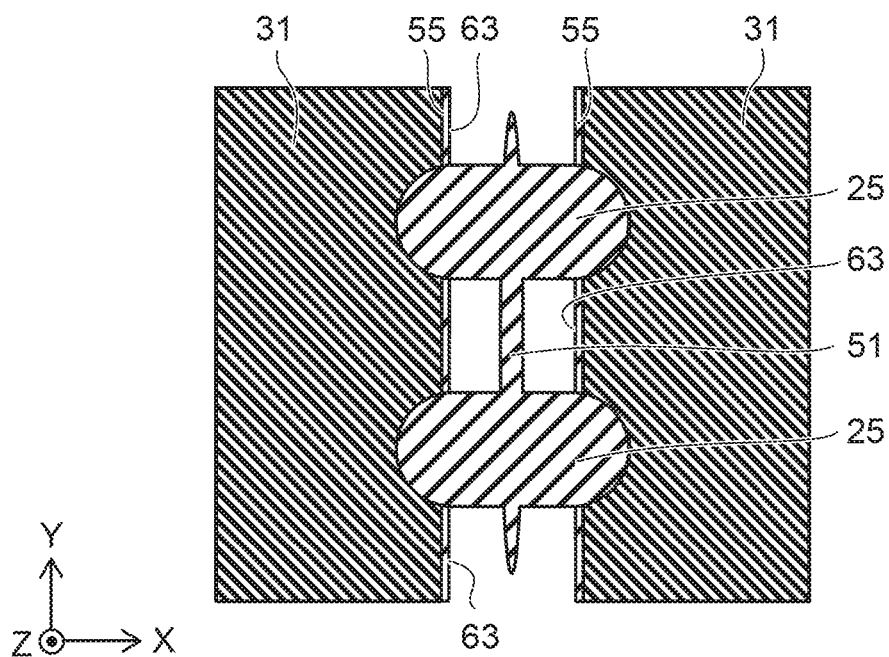

Next, as illustrated in FIGS. 31A and 31B, the sacrificial material 56 (see FIGS. 30A and 30B) made from silicon nitride is removed by carrying out wet etching using hot phosphoric acid. As a result, holes 63 are formed in the spaces where the sacrificial material 56 was present. The stopper film 55 made of silicon oxide, the insulating members 25, and the insulating members 51 remain at this time. The stopper film 55 is then removed by carrying out a wet treatment using hydrofluoric acid (HF).

Figure 32A:
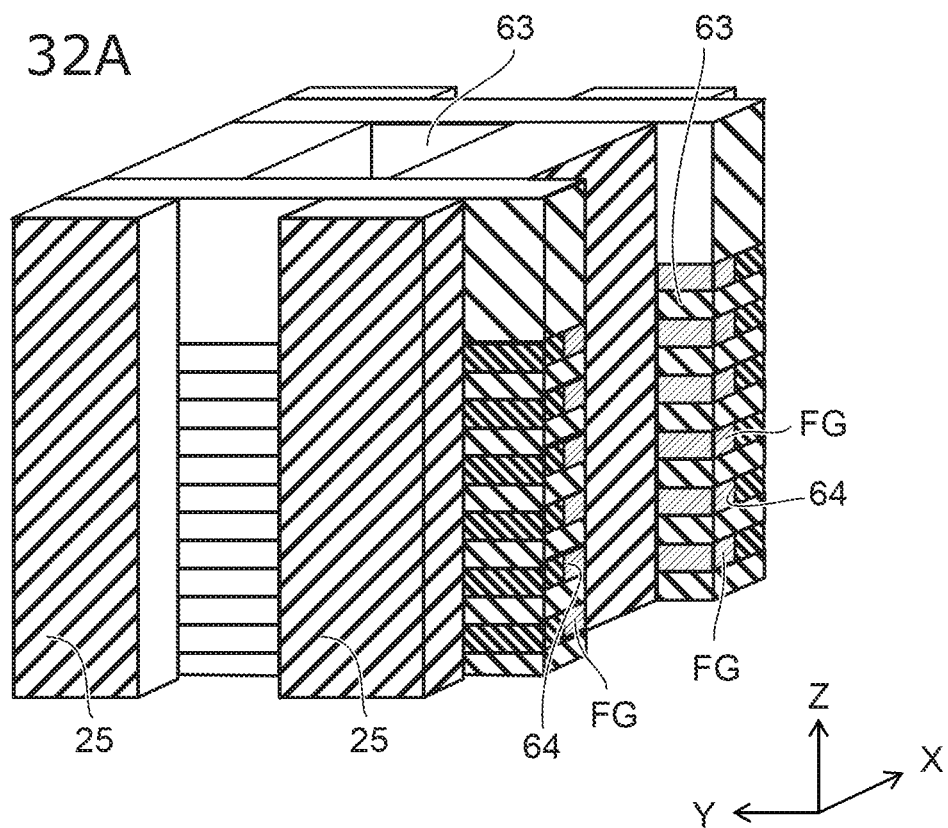
Figure 32B:
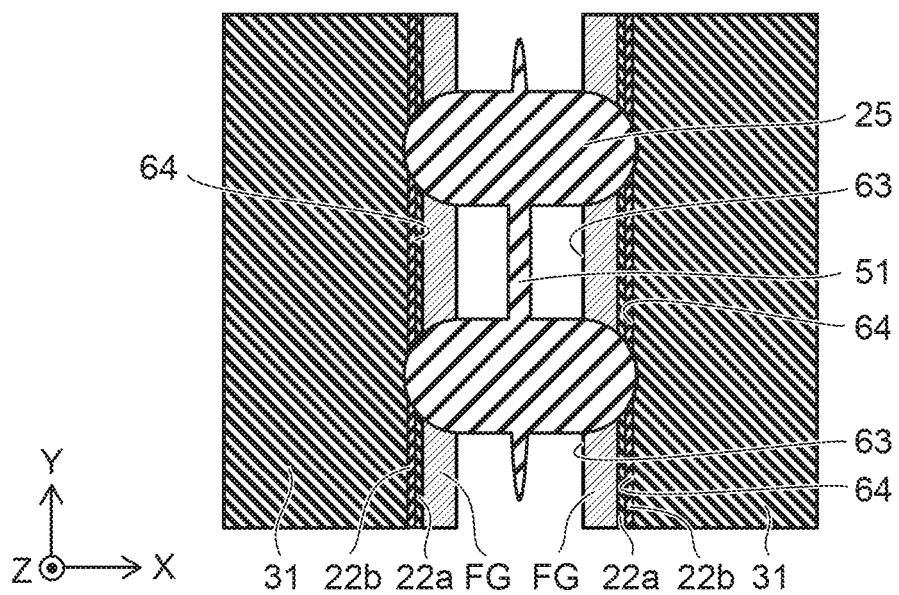

Next, as illustrated in FIGS. 32A and 32B, portions of the sacrificial films 31 exposed within the holes 63 are removed by carrying out wet etching using hot phosphoric acid, and recesses 64 are formed in the side surfaces of the holes 63. Next, silicon oxide is deposited through ALD, for example, and the low dielectric constant layers 22b are formed on the inner surfaces of the holes 63 and the recesses 64. Next, for example, a high dielectric constant material such as hafnium silicon oxide, aluminum oxide, or silicon nitride is deposited, thus forming the high dielectric constant layers 22a on the inner surfaces of the holes 63 and the recesses 64. Next, amorphous silicon is deposited, and a silicon film is formed on the inner surfaces of the holes 63 and in the recesses 64. Next, the silicon film is etched back using TMY (a choline solution), for example, and the high dielectric constant layers 22a and the low dielectric constant layers 22b are etched back using RIE, hot phosphoric acid, or the like. The low dielectric constant layers 22b, the high dielectric constant layers 22a, and the floating gate electrodes FG are formed in the recesses 64 as a result.

Figure 33A:
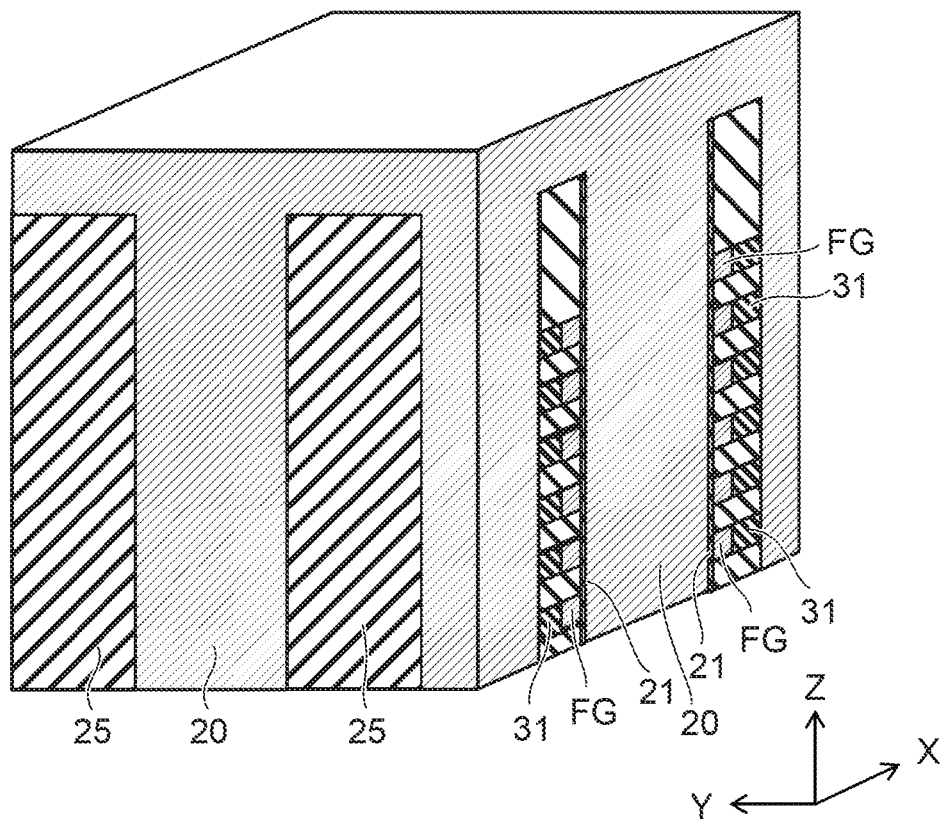
Figure 33B:
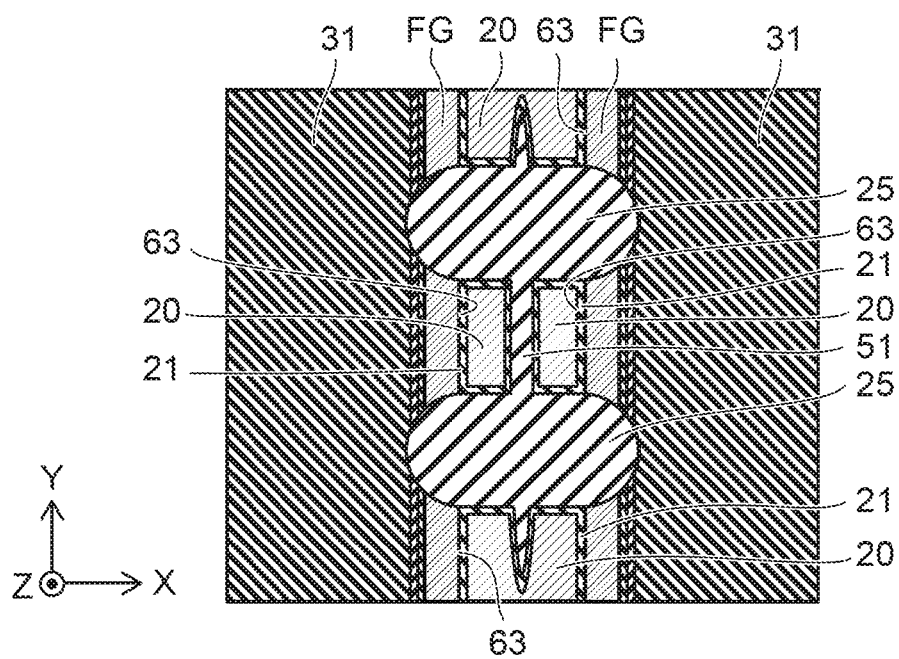

Next, the tunnel insulating films 21 are formed on the inner surfaces of the holes 63, as illustrated in FIGS. 33A and 33B. The tunnel insulating films 21 are formed on the surface of the interlayer insulating films 14, the surfaces of the floating gate electrodes FG, and the surfaces of the insulating members 25 and the insulating members 51. Next, the semiconductor members 20 are formed in the holes 63 through the same method as in the above-described first embodiment.

Figure 34A:
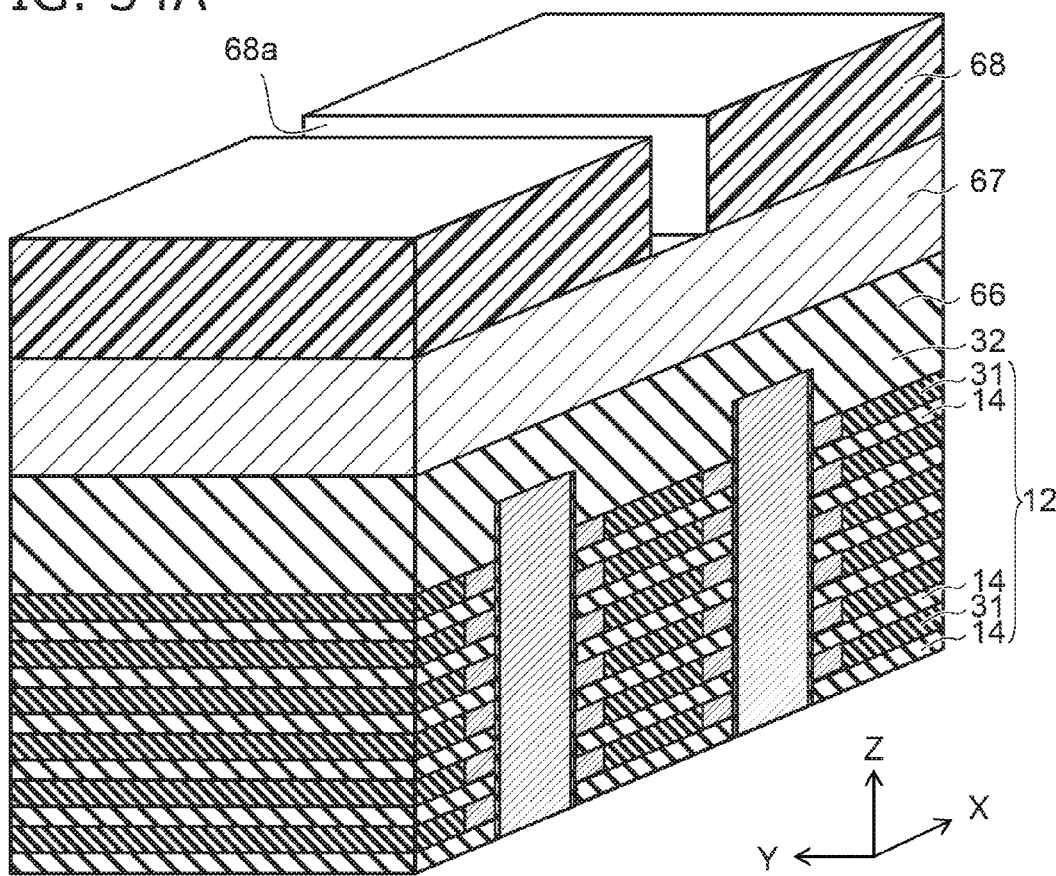
Figure 34B:
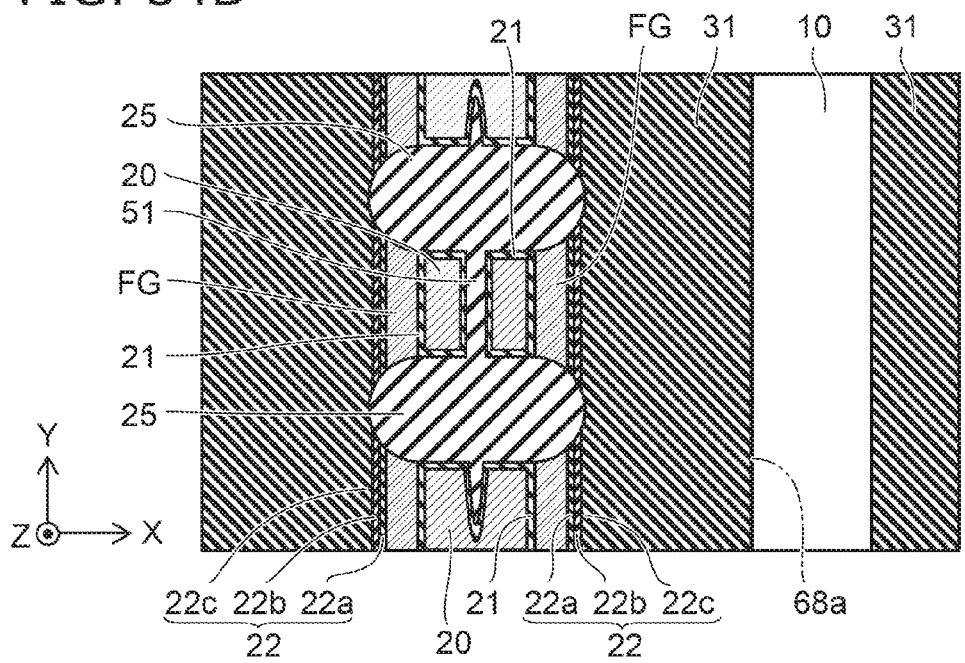

Next, as illustrated in FIGS. 34A and 34B, a mask film 66 made from silicon oxide, a hard mask film 67 containing carbon, an antireflective film (not illustrated), and a resist pattern 68 are formed on the mask film 32. Line-and-space shaped openings 68a extending in the Y-direction are formed in the resist pattern 68.

Figure 35A:
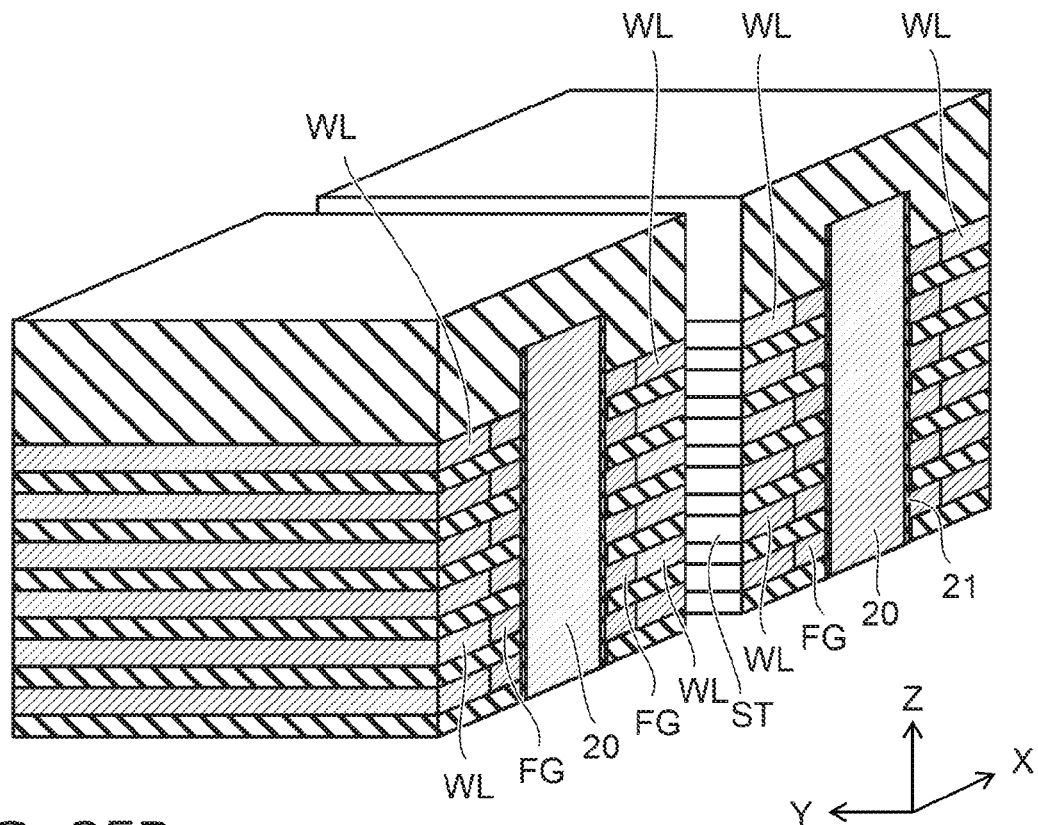
Figure 35B:
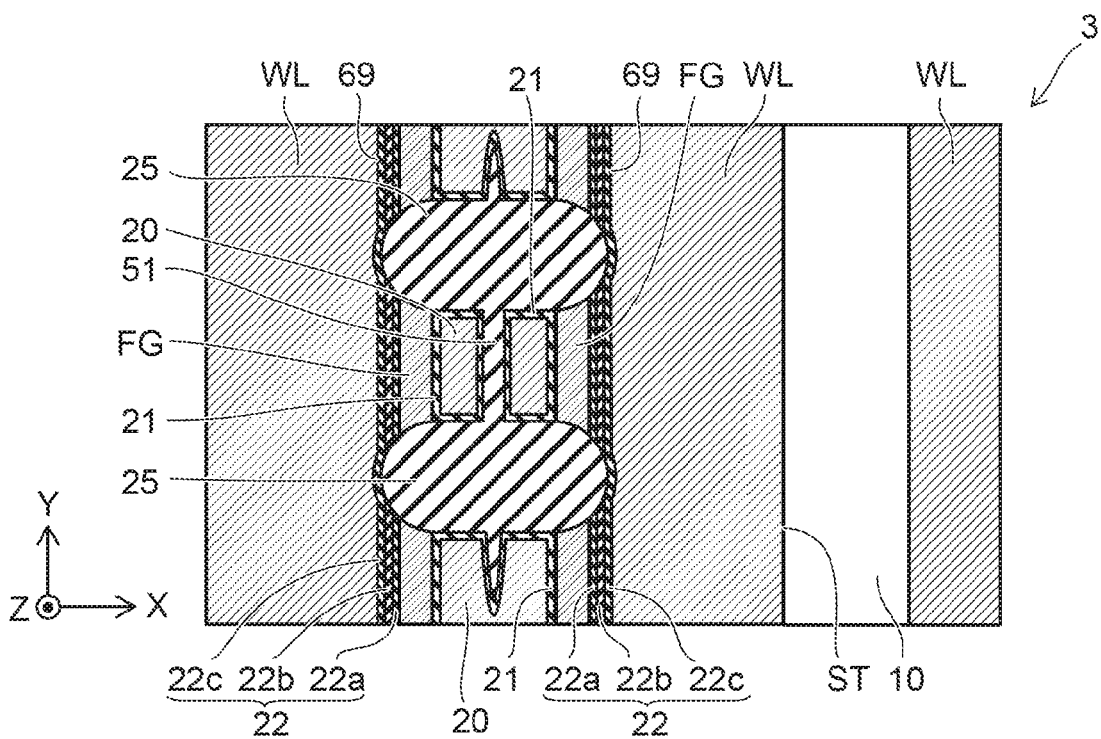

Next, as illustrated in FIGS. 35A and 35B, the slits ST are formed in the stacked body 12 by carrying out etching using the resist pattern 68 as a mask. Next, etching is carried out through the slits ST, removing the sacrificial films 31 (see FIGS. 34A and 34B) and forming spaces 69 between the interlayer insulating films 14. Next, the high dielectric constant layers 22c are formed on the inner surfaces of the spaces 69 through the slits ST. Next, the word lines WL are formed in the spaces 69 by depositing a conductive material through the slits ST. The rest of the manufacturing method is the same as in the above-described first embodiment. In this manner, the semiconductor memory device 3 according to the embodiment is manufactured.

Next, effects of the embodiment will be described.

In the embodiment, the insulating members 51 are provided in the semiconductor members 20, and thus interference between two memory cells that share a semiconductor member 20 can be suppressed.

Additionally, in the embodiment, even if the seams 57 are formed when the sacrificial material 56 is embedded in the processes illustrated in FIGS. 27A and 27B, the insulating members 51 are formed in the seams 57, which simply provides an effect of isolating the above-described memory cells. Thus problems such as semiconductor members 20 shorting through the seams 57 do not arise. This embodiment makes it possible to select the method for embedding the sacrificial material 56 with a focus on productivity and the like rather than on coatability. As a result, the semiconductor memory device 3 has a high level of productivity.

The configuration, manufacturing method, and effects of the embodiment other than those described above are the same as in the above-described first embodiment.

Fourth Embodiment

Next, a fourth embodiment will be described.

Figure 36:
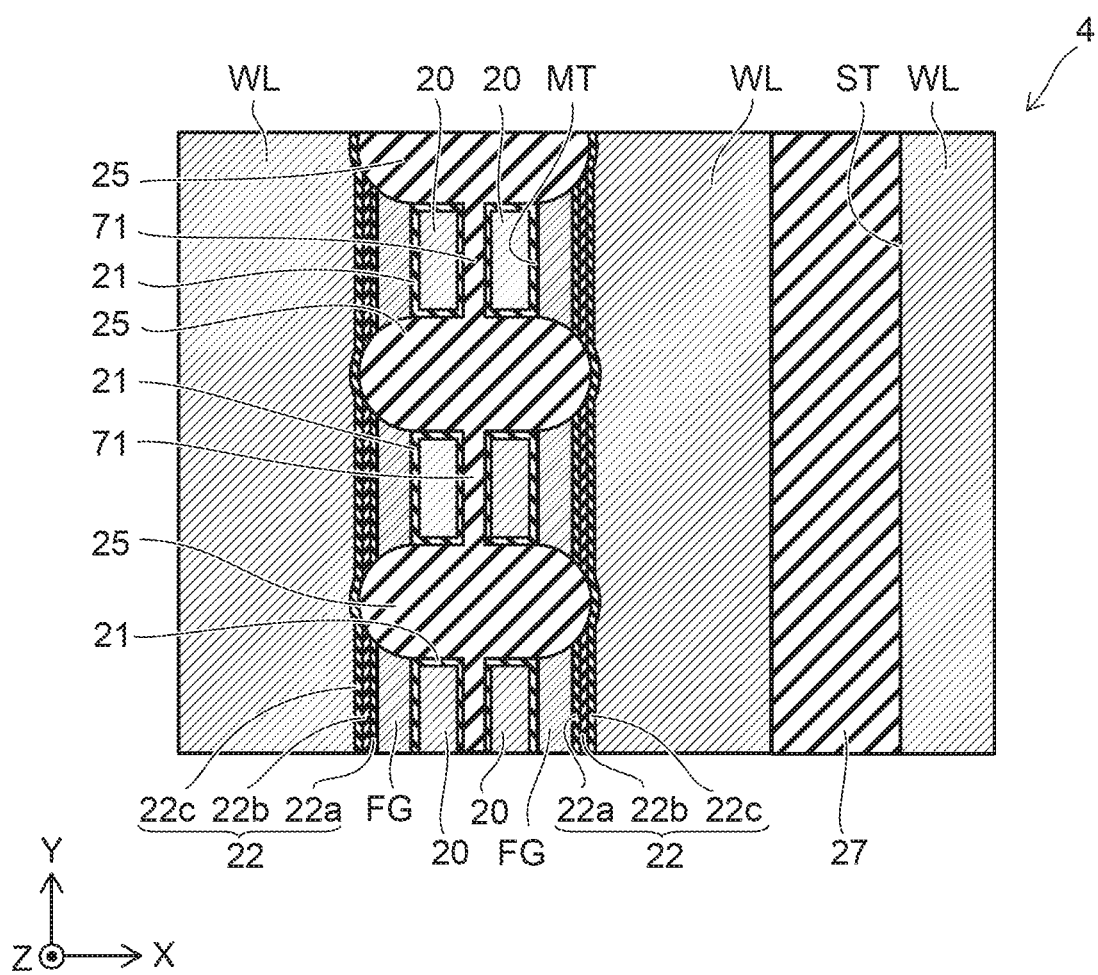
FIG. 36 is a cross-sectional view illustrating a semiconductor memory device according to a fourth embodiment.

FIG. 36 is a cross-sectional view illustrating a semiconductor memory device according to the embodiment.

As illustrated in FIG. 36, a semiconductor memory device 4 according to the embodiment differs from the above-described semiconductor memory device 3 according to the third embodiment (see FIGS. 26A and 26B) in that insulating members 71 are provided instead of the insulating members 51. The shape of each insulating member 71 is a plate-like shape that extends along the YZ plane. Each insulating member 71 passes through a plurality of semiconductor members 20 arranged along the Y-direction, passing through the semiconductor members 20 in the Y-direction and the Z-direction. In other words, each semiconductor member 20 is divided into two parts in the X-direction by the insulating member 71.

Next, a method for manufacturing the semiconductor memory device according to the embodiment will be described.

Figure 37A:
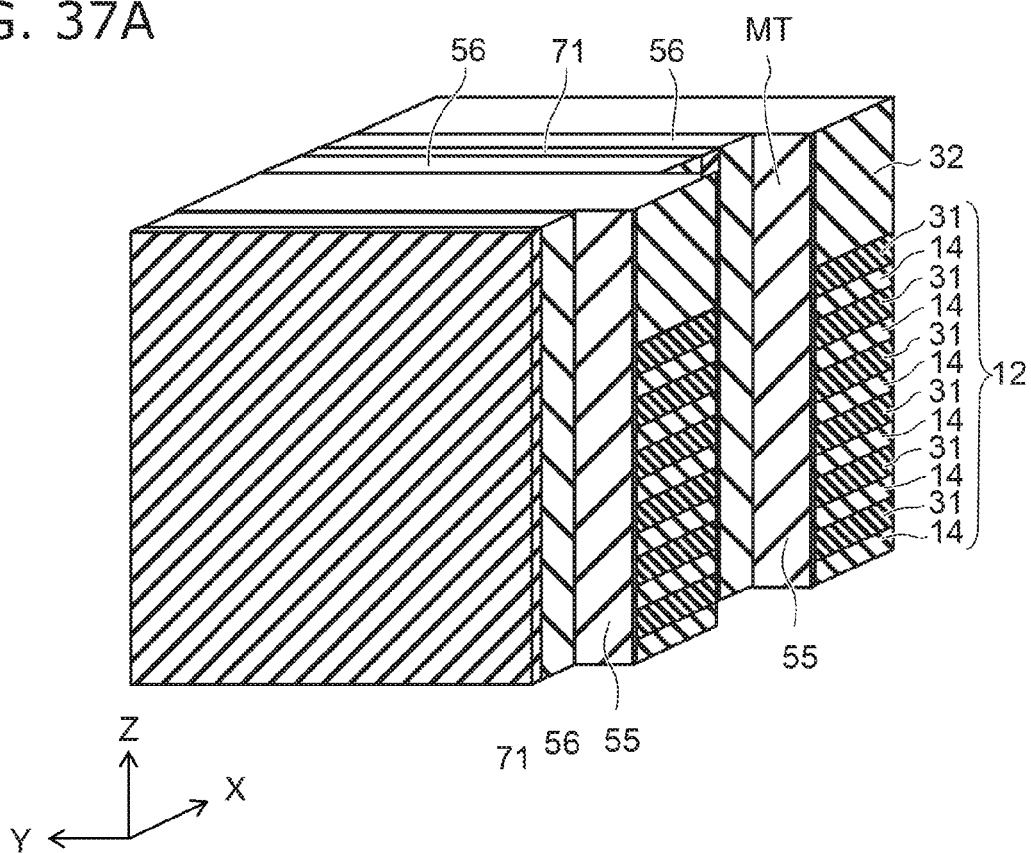
FIGS. 37A and 37B are diagrams illustrating a method for manufacturing a semiconductor memory device according to the fourth embodiment.
Figure 37B:
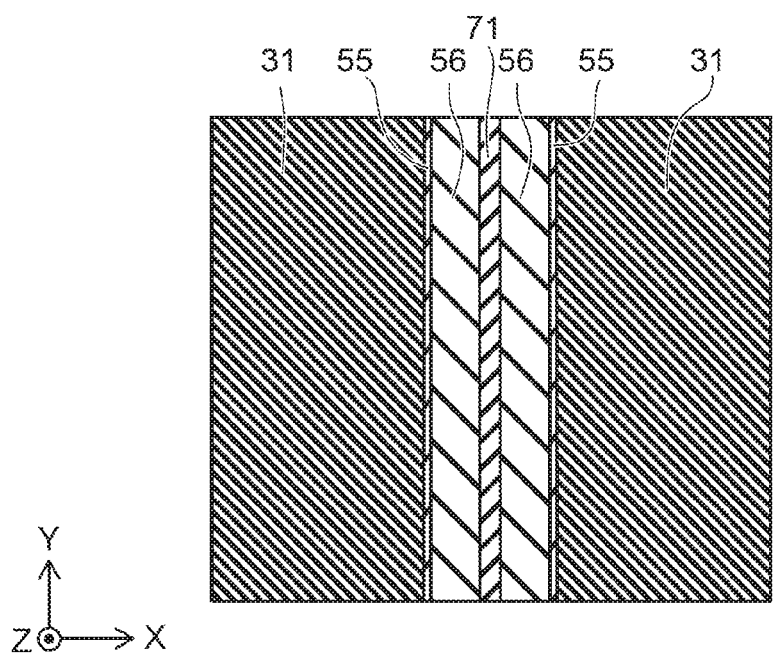

FIGS. 37A and 37B are diagrams illustrating the method for manufacturing the semiconductor memory device according to the embodiment.

FIGS. 37A and 37B illustrate the same process, where FIG. 37A is a perspective view and FIG. 37B is a cross-sectional view.

First, the processes illustrated in FIGS. 4 to 7 are carried out.

Next, as illustrated in FIGS. 37A and 37B, the sacrificial material 56 is formed as a film on both side surfaces of the memory trenches MT. The sacrificial material 56 is separated in the X-direction in each memory trench MT. Next, the insulating members 71 are formed between the sacrificial materials 56 in each memory trench MT by depositing silicon oxide, for example. The subsequent processes are the same as in the above-described third embodiment.

Next, effects of the embodiment will be described.

According to the embodiment, each semiconductor member 20 can be divided into two parts in the X-direction by providing the insulating members 71 in the memory trenches MT. As a result, the semiconductor members can be isolated between memory cells adjacent in the X-direction, and interference between memory cells can be reduced even more. The configuration, manufacturing method, and effects of the embodiment other than those described above are the same as in the above-described third embodiment.

Fifth Embodiment

Next, a fifth embodiment will be described.

Figure 38:
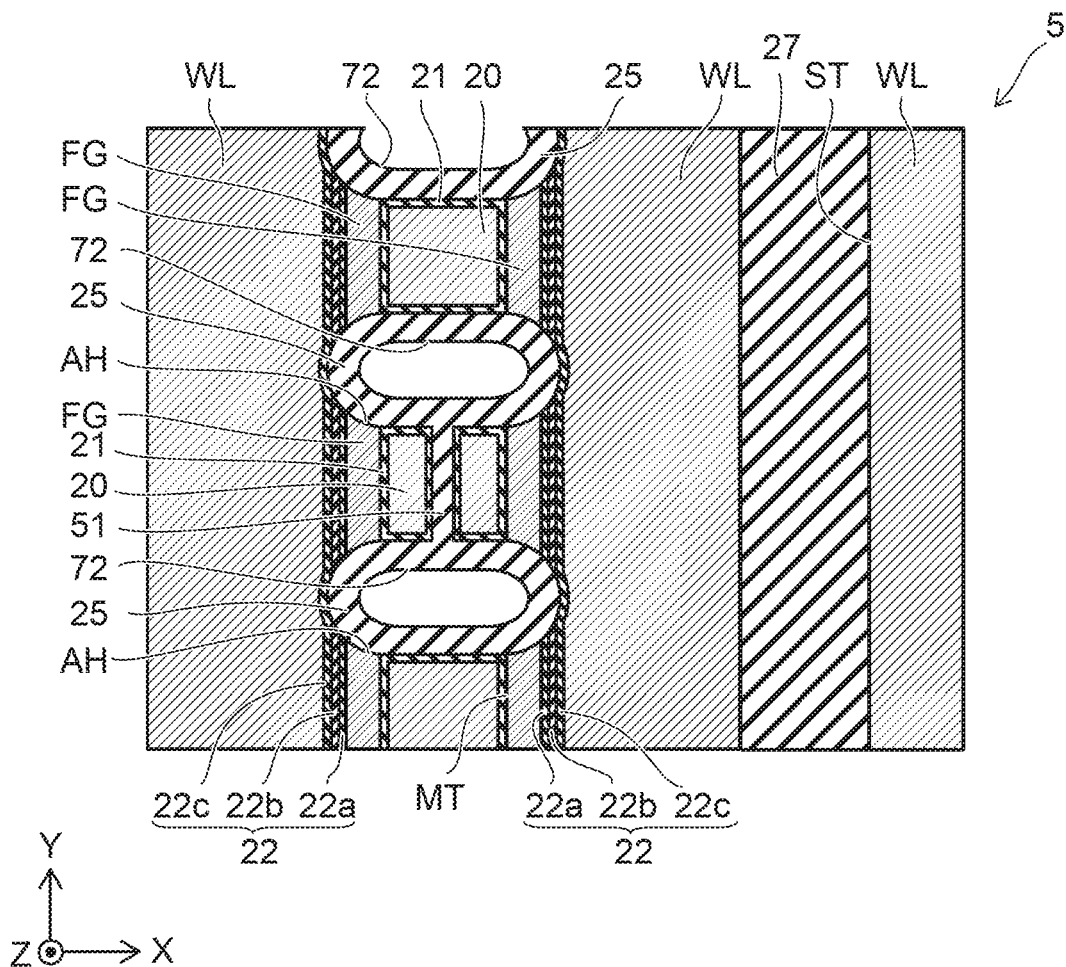
FIG. 38 is a cross-sectional view illustrating a semiconductor memory device according to a fifth embodiment.

FIG. 38 is a cross-sectional view illustrating a semiconductor memory device according to the embodiment.

As illustrated in FIG. 38, a semiconductor memory device 5 according to the embodiment differs from the above-described semiconductor memory device 3 according to the third embodiment (see FIGS. 26A and 26B) in that air gaps 72 are formed in the insulating members 25.

In the embodiment, the air gaps 72 are first formed in the insulating members 25 by depositing silicon oxide using a method having low coatability in the process of embedding the insulating members 25 in the holes AH illustrated in FIGS. 30A and 30B. Then, top ends of the air gaps 72 are closed off by depositing silicon oxide using a method having high coatability. The semiconductor memory device 5 can be manufactured in this manner.

According to the embodiment, forming the air gaps 72 in the insulating members 25 makes it possible to suppress electrical interference between memory cells adjacent in the Y-direction. The configuration, manufacturing method, and effects of the embodiment other than those described above are the same as in the above-described third embodiment.

Note that the above-described embodiments may be carried out in combination with each other. Additionally, although the above embodiments describe examples in which part of the block insulating film 22 is formed from the memory trench MT side and the remainder is formed from the slit ST or hole AH side, the embodiments are not limited thereto. The entire block insulating film 22 may be formed from the memory trench MT side, or may be formed from the slit ST side or the hole AH side.

According to the embodiments described above, it is possible to realize a highly-integrated semiconductor memory device and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
   a first structural body and a second structural body separated in a first direction and extending in a second direction intersecting with the first direction; and
   a plurality of interconnections, provided between the first structural body and the second structural body, extending in the second direction, and separated from each other along a third direction intersecting with a plane including the first direction and the second direction,
   the first structural body and the second structural body each including:
      an insulating member and a column-shaped body disposed in an alternating manner along the second direction and extending in the third direction; and
      an insulating film provided between the column-shaped body and the plurality of interconnections,
      the column-shaped body including:
         a first semiconductor member and a second semiconductor member separated from each other along the first direction and extending in the third direction; and
         an electrode provided between the first semiconductor member and each of the plurality of interconnections, and
   the insulating member of the first structural body and the insulating member of the second structural body making contact with the plurality of interconnections.

2. The semiconductor memory device according to claim 1, wherein one of the plurality of interconnections makes contact with both the insulating member of the first structural body and the insulating member of the second structural body.

3. The semiconductor memory device according to claim 1, further comprising:
   a second interconnection connected to the first semiconductor member; and
   a third interconnection connected to the second semiconductor member.

4. The semiconductor memory device according to claim 1, wherein the insulating film is also disposed between the column-shaped body and the insulating member.

5. A semiconductor memory device comprising:
   a first interconnection and a second interconnection separated in a first direction and extending in a second direction intersecting with the first direction;
   a first insulating member and a second insulating member, provided between the first interconnection and the second interconnection, separated from each other along the second direction, and extending in a third direction intersecting with a plane including the first direction and the second direction;
   a semiconductor member provided between the first insulating member and the second insulating member;
   a first electrode provided between the semiconductor member and the first interconnection;
   a second electrode provided between the semiconductor member and the second interconnection; and
   a third insulating member disposed within the semiconductor member and linked to the first insulating member and the second insulating member.

6. The semiconductor memory device according to claim 5, further comprising an insulating film provided between the semiconductor member and the first electrode, between the semiconductor member and the second electrode, between the semiconductor member and the first insulating member, between the semiconductor member and the second insulating member, and between the semiconductor member and the third insulating member.

7. The semiconductor memory device according to claim 5, wherein the third insulating member does not pass through the semiconductor member in the third direction.

8. The semiconductor memory device according to claim 5, wherein the third insulating member passes through the semiconductor member in the third direction.

9. The semiconductor memory device according to claim 5, wherein an air gap is formed in the first insulating member.

* * * * *